United States Patent
Fukushima

(10) Patent No.: US 7,708,050 B2
(45) Date of Patent: May 4, 2010

(54) COMPOSITE MATERIAL, HAVING HIGH THERMAL CONDUCTIVITY AND LOW THERMAL EXPANSION COEFFICIENT, AND HEAT-DISSIPATING SUBSTRATE, AND THEIR PRODUCTION METHODS

(75) Inventor: Hideko Fukushima, Saitama-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 11/678,405

(22) Filed: Feb. 23, 2007

(65) Prior Publication Data
US 2007/0132127 A1 Jun. 14, 2007

Related U.S. Application Data

(62) Division of application No. 10/845,257, filed on May 14, 2004, now Pat. No. 7,282,265.

(30) Foreign Application Priority Data
May 16, 2003 (JP) .............................. 2003-138121

(51) Int. Cl.
*B22D 23/00* (2006.01)
(52) U.S. Cl. .................. 164/97; 257/E23.027; 164/98; 264/29.1; 428/408
(58) Field of Classification Search .......... 257/E23.109, 257/E23.027; 164/97, 98; 264/29.1
See application file for complete search history.

(56) References Cited

U.S. PATENT DOCUMENTS

| | | | |
|---|---|---|---|
| 3,798,161 A | | 3/1974 | Hamner et al. |
| 5,249,621 A | * | 10/1993 | Aghajanian et al. ........... 164/97 |
| 5,410,796 A | | 5/1995 | Weeks, Jr. |
| 5,650,592 A | * | 7/1997 | Cheskis et al. .............. 174/540 |
| 5,834,115 A | | 11/1998 | Weeks et al. |
| 6,927,421 B2 | | 8/2005 | Ishikawa et al. |
| 6,933,531 B1 | * | 8/2005 | Ishikawa et al. .............. 257/76 |
| 2003/0082393 A1 | * | 5/2003 | Ishikawa et al. ......... 428/539.5 |
| 2003/0196825 A1 | | 10/2003 | Adams et al. |

FOREIGN PATENT DOCUMENTS

| | | |
|---|---|---|
| EP | 0 171 339 A | 2/1986 |
| EP | 1 055 650 A | 11/2000 |
| JP | 2000-203973 | 7/2000 |
| JP | 2001-058255 | 3/2001 |
| JP | 2001/058255 A | 3/2001 |

OTHER PUBLICATIONS

JP 2001-0058255 English Machine Translation, Noriaki et al, Mar. 2001.
JP 2000-203973 English Machine Translaton, Noriaki et al, Jul. 2000.

* cited by examiner

*Primary Examiner*—Sikyin Ip
(74) *Attorney, Agent, or Firm*—Sughrue Mion, PLLC

(57) ABSTRACT

A composite material having a high thermal conductivity and a small thermal expansion coefficient, which is obtained by impregnating a porous graphitized extrudate with a metal; the composite material having such anisotropy that the thermal conductivity and the thermal expansion coefficient are 250 W/mK or more and less than $4 \times 10^{-6}$/K, respectively, in an extrusion direction; and that the thermal conductivity and the thermal expansion coefficient are 150 W/mK or more and $10 \times 10^{-6}$/K or less, respectively, in a direction perpendicular to the extrusion direction.

20 Claims, 10 Drawing Sheets

COMPOSITE MATERIAL, HAVING HIGH THERMAL CONDUCTIVITY AND LOW THERMAL EXPANSION COEFFICIENT, AND HEAT-DISSIPATING SUBSTRATE, AND THEIR PRODUCTION METHODS

This application is a divisional of prior application Ser. No. 10/845,257, filed May 14, 2004 now U.S. Pat. No. 7,282,265.

FIELD OF THE INVENTION

The present invention relates to a composite material having a high thermal conductivity and a small thermal expansion coefficient, a heat-dissipating substrate formed therefrom, and methods for producing them, particularly to a composite material composed of a porous graphitized extrudate and aluminum or copper and thus having a high thermal conductivity, a small thermal expansion coefficient and small resistivity with substantially no thermal hysteresis, which is suitable for heat sinks for electronic equipment, etc., a heat-dissipating substrate such as a heat sink, etc. formed from such composite material, and methods for producing them.

BACKGROUND OF THE INVENTION

Because electronic parts have been increasing their heat generation as their integration, volume, output, etc. are increasing, demand is mounting on materials having a high thermal conductivity and a small thermal expansion coefficient. Because semiconductor devices such as CPUs, light-emitting diodes, etc. generate large amounts of heat, heat sinks are usually mounted to them. Heat transmitted from the semiconductor devices to the heat sinks is dissipated by fans or cooling media, etc. The heat sinks are usually made of aluminum, copper or their alloys having excellent thermal conductivity.

Because CPU, for instance, is much smaller than the heat sink, a high-thermal-conductivity body called "heat spreader" is usually interposed therebetween. Materials for the heat spreader preferably have a high thermal conductivity and as small a thermal expansion coefficient as that of the CPU made of silicon. This is true of light-emitting diodes made of compound semiconductors (GaAs, GaN, etc.). For such purposes, a lot of substrates made of composite materials of ceramics having small thermal expansion coefficients such as silicon carbide, alumina, silicon nitride or aluminum nitride and aluminum or copper have been proposed. However, substrates made of these composite materials are disadvantageously poor in workability because of containing ceramics. Though composite material substrates made of metals having small thermal expansion coefficients such as tungsten or molybdenum and copper have also been proposed, these composite material substrates are disadvantageously poor in workability.

Under the above circumstances, a lot of attempts have recently been proposed to use composite materials of carbon particles or fibers and metals for heat-dissipating substrates. For instance, JP 10-168502 A discloses a high-thermal-conductivity composite material obtained by mixing 1 to 200 parts by weight of one or more crystalline carbon materials selected from the group consisting of graphite, carbon fibers, carbon black, fullerene and carbon nanotubes, and 100 parts by weight of metal powder selected from the group consisting of Fe, Cu, Al, Ag, Be, Mg, W, Ni, Mo, Si, Zn and these alloys, and hot-pressing the resultant mixture. However, because this composite material has a structure containing crystalline carbon materials dispersed in a metal matrix, it has as large a thermal expansion coefficient as that of the metal matrix, though it has a high thermal conductivity.

JP 2000-203973 A discloses a carbon-based metal composite material comprising a carbonaceous matrix impregnated with at least one metal selected from the group consisting of aluminum, magnesium, tin, zinc, copper, silver. iron, nickel and their alloys, 90% by volume or more of voids in the carbonaceous matrix being impregnated with the metal, and the amount of the metal being 35% by volume or less of the entire carbon-based metal composite material.

JP 2001-58255 A discloses a carbon-based metal composite material produced by impregnating carbon moldings comprising carbon particles or fibers containing graphite crystals with aluminum, copper, silver or these alloys at high pressure by a melt-forging method, which has a thermal conductivity of 150 W/mK or more and a thermal expansion coefficient of $4 \times 10^{-6}/K$ to $12 \times 10^{-6}/K$ in a thickness direction at room temperature. This carbon-based metal composite material has a structure comprising a graphite matrix having high rigidity, a high thermal conductivity and a small thermal expansion coefficient as a skeleton, with its voids impregnated with a metal. Accordingly, it has both small thermal expansion coefficient inherent in graphite and high thermal conductivity inherent in a metal.

Despite the above advantages, these carbon-based metal composite materials are disadvantageous in having much larger thermal expansion coefficients than those of silicon and compound semiconductors. Large differences from silicon and compound semiconductors in a thermal expansion coefficient undesirably exert large thermal stress to CPUs or light-emitting diodes during soldering or brazing heat-dissipating substrates to the CPUs or the light-emitting diodes, or during the operation of the CPUs or the light-emitting diodes. Accordingly, a stress-relieving member is usually interposed between the CPU or the light-emitting diode and the heat-dissipating substrate. However, because the stress-relieving member does not necessarily have a sufficiently large thermal conductivity, the use of the carbon-based metal composite material having a high thermal conductivity for the heat-dissipating substrate does riot exhibit its effect sufficiently.

Further, when the heat-dissipating substrate is bonded to the CPU or the light-emitting diode, soldering is usually conducted at about 200 to 300° C. in the case of an aluminum-impregnated graphite substrate, and brazing is usually conducted at about 700 to 800° C. in the case of a copper-impregnated graphite substrate. It has been found, however, that when exposed to such high temperature, the composite substrate impregnated with aluminum or copper exhibits extremely different sizes due to a residual stress before and after the heating. Such thermal hysteresis causes warp in the heat-dissipating substrate bonded to the CPU or the light-emitting diode, so that the heat-dissipating substrate may finally be broken, or that the CPU or the laser diode, etc. may also be damaged by thermal stress.

OBJECTS OF THE INVENTION

Accordingly, an object of the present invention is to provide a composite material having a high thermal conductivity and as small a thermal expansion coefficient as those of silicon and compound semiconductors, with substantially no thermal hysteresis.

Another object of the present invention is to provide a heat-dissipating substrate formed from a composite material having a high thermal conductivity and a small thermal expansion coefficient.

A further object of the present invention is to provide a method for producing such a composite material having a high thermal conductivity and a small thermal expansion coefficient.

A still further object of the present invention is to provide a method for producing such a heat-dissipating substrate having a high thermal conductivity and a small thermal expansion coefficient.

SUMMARY OF THE INVENTION

As a result of intense research in view of the above objects, the inventor has found that by impregnating a porous graphitized extrudate with a molten metal and then heat-treating the resultant composite material, it is possible to (a) increase the thermal conductivity and decrease the thermal expansion coefficient to the same level as those of silicon and compound semiconductors, and (b) substantially remove thermal expansion hysteresis, thereby providing the composite material with good dimensional stability when heated. The present invention has been completed based on this finding.

Thus, the composite material of the present invention having a high thermal conductivity and a small thermal expansion coefficient is obtained by impregnating a porous graphitized extrudate with a metal, having such anisotropy that the thermal conductivity and the thermal expansion coefficient are 250 W/mK or more and less than $4\times10^{-6}$/K, respectively, in an extrusion direction; and that the thermal conductivity and the thermal expansion coefficient are 150 W/mK or more and $10\times10^{-6}$/K or less, respectively, in a direction perpendicular to the extrusion direction.

In a preferred embodiment of the present invention, the thermal conductivity is 250 W/mK or more in an extrusion direction and 150 W/mK or more in a direction perpendicular to said extrusion direction, and the thermal expansion coefficient is $0.1\times10^{-6}$/K or more and less than $4\times10^{-6}$/K in the extrusion direction and $4\times10^{-6}$/K or more and $10\times10^{-6}$/K or less in the perpendicular direction.

In a preferred embodiment of the present invention, a dimensional change ratio due to thermal hysteresis is within ±0.1% in the extrusion direction and in a direction perpendicular to the extrusion direction after a heat treatment, meaning that the composite material has substantially no thermal expansion hysteresis.

The heat-dissipating substrate of the present invention is composed of the above composite material having a high thermal conductivity and a small thermal expansion coefficient, and has a thickness direction substantially in alignment with the extrusion direction of the porous graphitized extrudate, and a surface perpendicular to the extrusion direction, onto which a heat-generating body is going to be bonded.

The method for producing a composite material having a high thermal conductivity and a small thermal expansion coefficient according to the present invention comprises the steps of (1) graphitizing an extrudate of carbon particles and/or carbon fibers and tar pitch by burning; (2) impregnating the resultant porous graphitized extrudate with a molten metal at high temperature and pressure; and (3) heat-treating the resultant graphite/metal composite material.

The method for producing a heat-dissipating substrate having a high thermal conductivity and a low thermal expansion according to the present invention comprises the steps of producing a composite material having a high thermal conductivity and a small thermal expansion coefficient by the above method; and then cutting the composite material along a surface substantially perpendicular to the extrusion direction of the porous graphitized extrudate. Said perpendicular surface is preferably used as a surface, onto which a heat-generating body is going to be bonded.

The thus obtained composite material having a high thermal conductivity and a small thermal expansion coefficient is cut to a plate shape having a thickness of about 0.1 to 100 mm, desirable for use as heat sinks, etc. The metal-impregnated composite material is usually cut to a plate shape after the heat treatment. However, when the heat-dissipating substrate is required to have a shape with extremely high precision, the metal-impregnated composite material is preferably heat-treated after cut to a plate shape, and cut to the target shape again. In any case, the heat-dissipating substrate of the present invention formed from the porous graphitized extrudate has a dimensional change ratio of within ±0.1% due to thermal hysteresis both in an extrusion direction and in a perpendicular direction. Accordingly, even though it is subjected to thermal stress during brazing, etc., it is free from warp and peeling at bonding interfaces, etc. after cooling.

The composite material of the present invention having a high thermal conductivity and a small thermal expansion coefficient has anisotropy in the thermal conductivity and the thermal expansion coefficient. Specifically, its thermal conductivity is 250 W/mK or more and its thermal expansion coefficient is lower than $4\times10^{-6}$/K in the extrusion direction, and its thermal conductivity is 150 W/mK or more and its thermal expansion coefficient is $10\times10^{-6}$/K or less in a direction perpendicular to the extrusion direction. Accordingly, when used for heat sinks or heat spreaders, etc. for semiconductor devices, the influence of thermal stress is suppressed, and heat spreads in a lateral direction and is well conducted in a thickness direction, achieving efficient heat dissipation. In addition, it has a small thermal expansion coefficient in the thickness direction, it exhibits high dimensional precision in the thickness direction when assembled to a package, making it possible to provide a high-sealing package.

The preferred structure of the composite material of the present invention having a high thermal conductivity and a small thermal expansion coefficient will be explained below. The composite material of the present invention having a high thermal conductivity and a small thermal expansion coefficient preferably has a bulk density of 1.9 g/cm$^3$ or more, with the metal in an amount of 10 to 30% by volume.

The resistivity of the composite material having a high thermal conductivity and a small thermal expansion coefficient is preferably 4 μΩm or less in the extrusion direction, and 7 μΩm or less in the perpendicular direction. The more preferred resistivity is 2 μΩm or less in the extrusion direction, and 3.5 μΩm or less in the perpendicular direction.

The metal in the composite material having a high thermal conductivity and a small thermal expansion coefficient is preferably at least one selected from the group consisting of aluminum, copper, chromium, silver, magnesium and zinc or an alloy comprising one or more of said metals. In a preferred embodiment, the metal is aluminum alloy comprising 11 to 14% by mass of silicon, the balance being substantially aluminum and inevitable impurities, the percentage of a needle-shaped structure having a length of 30 μm or less and an aspect ratio (length/diameter) of 10 or more being preferably 10% or less, more preferably 5% or less, in a silicon (Si)-rich phase precipitated in the metal. The amount of oxygen in the aluminum alloy is preferably 400 ppm or less. When the metal is copper or its alloy, the amount of oxygen in the mew is preferably 400 ppm or less, more preferably 250 ppm or less.

The porous graphitized extrudate used in the present invention is preferably composed of carbon particles such as cokes, etc. and tar pitch, and the carbon particles preferably have an average particle size of 50 μm or more. The ash content of the extrudate is preferably 0.5% by mass or less, more preferably 0.3% by mass.

The resistivity of the porous graphitized extrudate used in the present invention is preferably less than 7 μΩm in an extrusion direction, and 7 μΩm or more in a direction perpendicular to the extrusion direction, and the ratio of the resistivity in the extrusion direction to that in the perpendicular direction is preferably 0.9 or less. More preferably, the resistivity of the porous graphitized extrudate is 6 μΩm or less in the extrusion direction, and 8 μΩm or more in the direction perpendicular to the extrusion direction, and the resistivity ratio (extrusion direction/perpendicular direction) is 0.6 or less.

The thermal expansion coefficient of the porous graphitized extrudate used in the present invention is preferably $3\times10^{-6}$/K or less in the extrusion direction, and $4\times10^{-6}$/K or less in the direction perpendicular to the extrusion direction, and the ratio of the thermal expansion coefficient in the extrusion direction to that in the perpendicular direction is 0.8 or less. More preferably, the thermal expansion coefficient of the porous graphitized extrudate is $1\times10^{-6}$/K or less in the extrusion direction, and $3\times10^{-6}$/K or less in the direction perpendicular to the extrusion direction, and the thermal expansion coefficient ratio (extrusion direction/perpendicular direction) is 0.5 or less.

The thermal conductivity of the porous graphitized extrudate used in the present invention is preferably 150 W/mK or more in the extrusion direction, and 80 W/mK or more, more preferably 100 W/mK or more, in a direction perpendicular to the extrusion direction. The ratio of the thermal conductivity in the extrusion direction to that in the perpendicular direction is preferably 1.3 or more, more preferably 1.5 or more.

When the metal is aluminum or its alloy, the impregnation of the porous graphitized extrudate with the molten metal is preferably conducted at a temperature higher than the melting point by 10° C. or more and at a pressure of 10 MPa or more, and the heat treatment of the graphite/metal composite material is preferably conducted under the conditions of a temperature of (the melting point-10° C.) or less and 200° C. or higher, at a temperature-elevating speed of 30° C./minute or less, and a cooling speed of 20° C./minute or less More preferably, the temperature-elevating speed is 10° C./minute or less, and the cooling speed is 10° C./minute or less.

When the metal is copper or its alloy, the impregnation of the porous graphitized extrudate with the molten metal is preferably conducted at a temperature higher than the melting point by 10° C. or more and at a pressure of 10 MPa or more, and the heat treatment of the graphite/metal composite material is preferably conducted under the conditions of a temperature of (the melting point-10° C.) or less and 300° C. or higher, at a temperature-elevating speed of 30° C./minute or less, and at a cooling speed of 20° C./minute or less. More preferably, the temperature-elevating speed is 10° C./minute or less, and the cooling speed is 10° C./minute or less.

DETAILED DESCRIPTION OF THE PREFERRED EMBODIMENTS

Figure 1A:
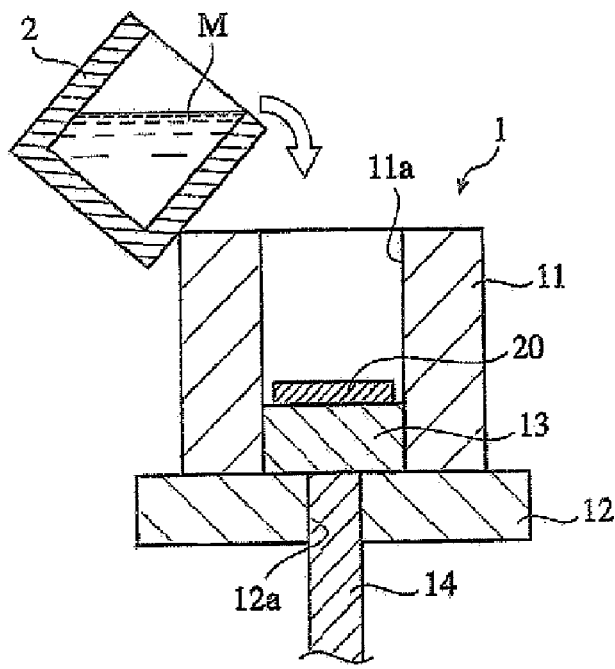
FIG. 1(a) is a schematic cross-sectional view showing a die apparatus for melt-forging a porous graphitized extrudate, which comprises a cavity in which a porous graphitized extrudate is placed and into which a molten metal is poured.

[1] Composite Material Having High Thermal Conductivity and Small Thermal Expansion Coefficient (A) Structure (1) Porous Graphitized Extrudate The porous graphitized extrudate used in the present invention preferably has a bulk density of 2 g/cm³ or less, particularly 1.6 to 1.95 g/cm³. When the bulk density is more than 2 g/cm³, the impregnation of a molten metal is insufficient, failing to obtain sufficient effects of improving its thermal conductivity. On the other hand, when the bulk density is less than 1.6 g/cm³, the graphite skeleton has insufficient strength, so that the thermal expansion coefficient of the entire composite material is largely influenced by the thermal expansion coefficient of a metal. The more preferred bulk density of the porous graphitized extrudate is 1.65 to 1.85 g/cm³.

(2) Impregnating Metal

A molten metal impregnated into the porous graphitized extrudate is preferably at least one metal selected from the group consisting of aluminum, copper, chromium, silver, magnesium and zinc or an alloy comprising one or more of the metals. Particularly, the aluminum alloy is preferably an aluminum-silicon alloy containing 11 to 14% by mass of silicon. The reason therefore seems to be that the inclusion of 11 to 14% by volume of silicon lowers the melting point of a molten metal, thereby suppressing the generation of aluminum carbide, and thus preventing decrease in thermal conductivity. An additional reason seems to be that needle-shaped silicon particles contained in the alloy are spheroidized by the heat treatment, resulting in a decreased heat resistance and thus improved thermal conductivity.

The copper alloy is preferably a chromium-copper alloy. The reason therefore seems to be that chromium contained in the alloy improves the strength of an interface between graphite and copper, resulting in improvement in the strength of the composite material. The content of chromium is 0.1 to 10% by mass, preferably 0.1 to 5% by mass, more preferably 0.1 to 2% by mass.

The percentage of the metal in the composite material is preferably 10 to 30% by volume. When the amount of the metal impregnating the porous graphitized extrudate is less than 10% by volume of the composite material, the bulk density of the composite material is less than 1.9 g/cm³, resulting in insufficient effects of improving the thermal conductivity by metal impregnation. On the other hand, when the metal is more than 30% by volume, the amount of the impregnating metal is too much to the graphite skeleton, so that the thermal expansion coefficient of the entire composite material is largely influenced by the thermal expansion coefficient of the metal, resulting in too large difference in a thermal expansion coefficient from silicon and compound semiconductors. The more preferred percentage of the metal in the composite material is 5 to 25% by volume.

Because the voids of the porous graphitized extrudate are filled with the metal as densely as possible, the bulk density of the composite material is preferably 1.9 g/cm³ or more. When the bulk density of the composite material is less than 1.9 g/mc³, the composite material has too much a void ratio, failing to sufficiently improve the thermal conductivity. On the other hand, when the bulk density is more than 5 g/cm³, the high-pressure impregnation process needs too strict conditions of temperature and pressure, making the production of the composite material difficult and thus costly. The more preferred bulk density of the composite material is 1.9 to 4 g/cm³.

(B) Production Method (1) Production of Porous Graphitized Extrudate

The porous graphitized extrudate per se can be produced by known methods. Typically, carbon materials such as cokes, etc. are pulverized and classified to a proper size, and then melt-blended with pitch as a binder. The resultant blend is extruded from a die orifice having a predetermined shape, cut to a predetermined length and then burned for graphitization. In place of the carbon powder, carbon fibers may be used, and a mixture of carbon powder and carbon fibers may be used.

The average particle size of the carbon powder such as coke powder, etc. is preferably 50 μm or more. When the average particle size of the carbon powder is less than 50 μm, the resultant porous graphitized extrudate has an insufficient thermal conductivity. When the average particle size of the carbon powder is more than 3 mm, the resultant porous graphitized extrudate disadvantageously has insufficient mechanical strength. The more preferred average particle size of the carbon powder is about 50 μm to about 3 mm. The carbon fibers are preferably pitch carbon fibers with an average length of about 50 μm to about 5 mm.

A mixing ratio of carbon powder and/or carbon fibers to pitch is preferably 10:1 to 10:4, more preferably 10:2 to 10:3, by weight. When the mixing ratio is less than 10:1 or more than 10:4, the resultant blend has improper viscosity, resulting in difficulty in extrusion.

The melt blend of carbon powder and/or carbon fibers and tar pitch is extruded from the die at a temperature of 100° C. to 140° C.

To obtain the graphite/metal composite material having excellent thermal conductivity and thermal expansion coefficient, the porous graphitized extrudate is preferably composed of high-purity graphite. Specifically, an ash content in the porous graphitized extrudate is preferably 0.5% by mass or less, more preferably 0.3% by mass or less. The porous graphitized extrudate is burned at 700° C. to 1000° C. after extrusion. Because the burned molded body has many voids, pitch is introduced into the voids of the burned molded body and burned again, to achieve a bulk density of 1.65 g/cm³ or more. Thereafter, the molded body is heat-treated at a temperature of 2600° C. to 3000° C. for graphitization, which turns carbon to graphite, thereby providing a porous graphitized extrudate. To obtain the graphite/metal composite material having a high thermal conductivity and a small thermal expansion coefficient, incombustible mineral materials (ash content) remaining after burning the porous graphitized extrudate should be 0.5% by mass or less, namely, the porous graphitized extrudate should be turned to high-purity graphite.

(2) Impregnation of Metal

The impregnation of the porous graphitized extrudate with a molten metal can be conducted by a melt-forging method. One example of die apparatuses suitable for conducting the melt-forging method is shown in FIG. 1. As shown in FIG. 1(a), the die apparatus 1 comprises an upper die portion 11 having a center cavity 11a, a lower die portion 12 disposed under the upper die portion 11 and having a center opening 12a, a lower punch 13 disposed in a cavity 11a of the upper die portion 11, a shaft 14 connected to the bottom of the lower punch 13 and passing through an opening 12a of the lower die portion 12, an upper punch 15 entering into the cavity 11a of the upper die portion 11, and a plunger shaft 16 connected to an upper surface of the upper punch 15.

As shown in FIG. 1(a), the upper punch 15 is removed, and the porous graphitized extrudate 20 is placed on the lower punch 13, which is lowered to the bottom of the cavity 11a of the upper die portion 11. In this state, a molten metal M is poured from a ladle 2 into the cavity 11a. At this time, it is preferable that the upper and lower die portions 11, 12, the porous graphitized extrudate, etc. are heated to a predetermined temperature in advance, and that the molten metal M in a sufficient amount is poured into the cavity 11a to prevent the solidification of the molten metal M during the impregnation. To prevent the porous graphitized extrudate 20 from floating while pouring the molten metal, a weight made of iron, etc. is more preferably placed on the porous graphitized extrudate 20.

Figure 1B:
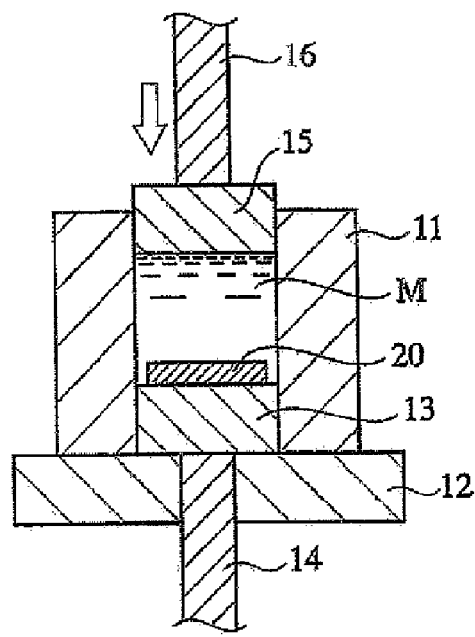
FIG. 1(b) is a schematic cross-sectional view showing the die apparatus of FIG. 1(a) for melt-forging the molten metal containing the porous graphitized extrudate.
Figure 1C:
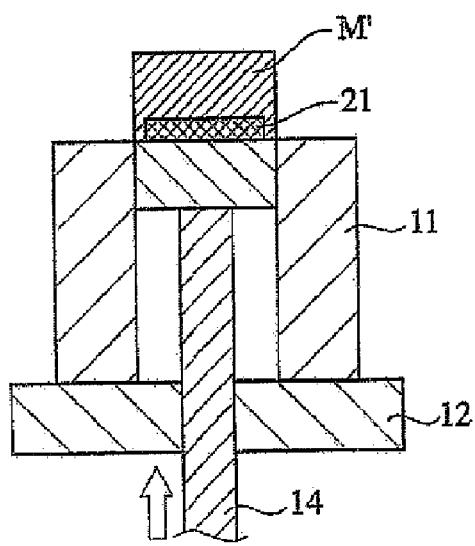
FIG. 1(c) is a schematic cross-sectional view showing the die apparatus of FIG. 1(a), from which a melt-forged product is taken out.
Figure 1D:
FIG. 1(d) is a cross-sectional view showing a metal-impregnated porous graphitized extrudate cut out from the melt-forged product.

As shown in FIG. 1(b), the upper punch 15 is caused to enter into the cavity 11a to press the molten metal M via the plunger shaft 16 at a high pressure, such that the high-pressure molten metal M penetrates into the voids of the porous graphitized extrudate 20. After the molten metal M entering into the porous graphitized extrudate 20 is solidified, as shown in FIG. 1(c), the upper punch 15 is removed, and the lower punch 13 is then elevated, to take out the resultant metal-impregnated porous graphitized extrudate 21. Finally, the metal-impregnated porous graphitized extrudate 21 is cut out from the solidified metal M' as shown in FIG. 1(d). To prevent the molten metal M from being solidified before fully entering into the voids of the porous graphitized extrudate 20 under high pressure, it is preferable to heat the upper and lower die portions 11, 12 and the upper and lower punches 13, 15 at a predetermined temperature during the melt-forging.

The melt-forging temperature is preferably higher than the melting point of the molten metal by 10° C. or more, though it may vary depending on the types of the molten metal. Specifically, the melt-forging temperature of each metal or its alloy is as shown in Table 1 below. When the melt-forging temperature is lower than the lower temperature limit in any molten metal, the intrusion of the molten metal into the voids of the porous graphitized extrudate is insufficient. Effects obtained by elevating the melt-forging temperature are substantially saturated at the upper temperature limit, and further improvement in the effects cannot be obtained even by elevating the melt-forging temperature. The temperature of the porous graphitized extrudate is preferably heated at a temperature equal to the melting point of the molten metal, particularly at a temperature higher than the melting point of the molten metal in advance, in any molten metal before the impregnation, because such heating makes it possible to fully impregnate the voids of the extrudate with the molten metal.

The melt-forging pressure should be 10 MPa or more regardless of the types of the molten metal. It is more preferably 50 MPa or more. If the melt-forging pressure were lower than the lower temperature limit, the intrusion of the molten metal into the voids of the porous graphitized extrudate would be insufficient in any molten metal. Effects obtained by elevating the melt-forging pressure are substantially saturated at the upper pressure limit, and farther improvement in the effects cannot be obtained by elevating the melt-forging pressure.

The pressing time may generally be 1 to 30 minutes regardless of the type, temperature and pressure of the molten metal. When the pressing time is less than 1 minute, the porous graphitized extrudate is not fully impregnated with the molten metal. On the other hand, when it is more than 30 minutes, the temperature of the molten metal becomes too low, failing to achieve further impregnation.

(3) Heat Treatment

Figure 2:
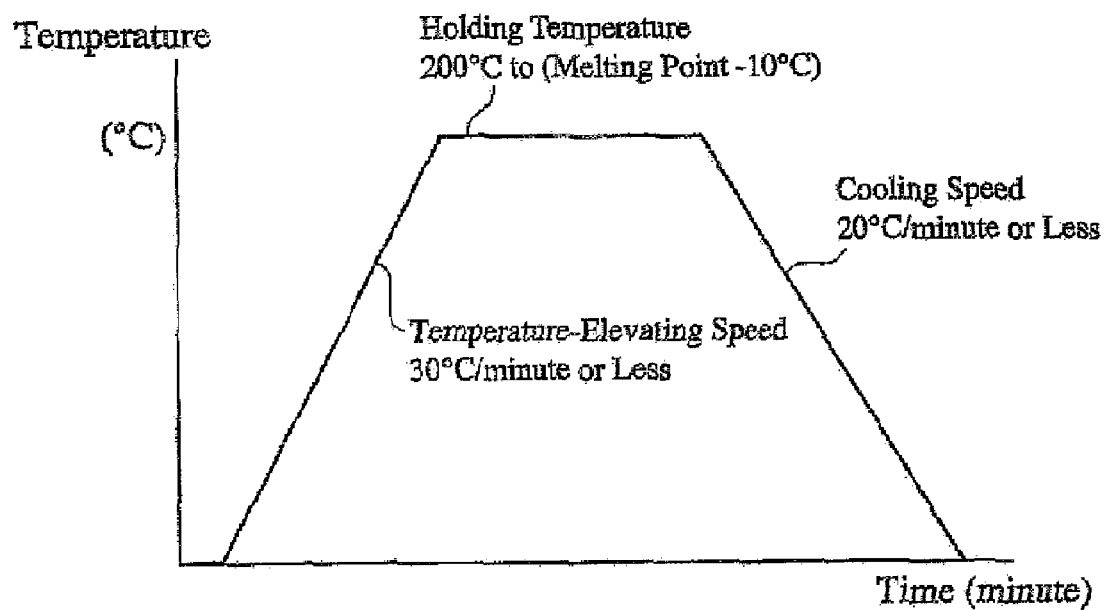
FIG. 2 is a graph schematically showing a heat treatment pattern conducted on the graphite/metal composite material of the present invention.

FIG. 2 shows a preferable heat treatment pattern for the graphite/metal composite material of the present invention. The temperature-elevating speed of the graphite/metal composite material is preferably 30° C./minute or less, more preferably 10° C./minute or less. When the temperature-elevating speed is more than 30° C./minute, the temperature of the composite material does not become uniform. The lower limit of the temperature-elevating speed may be about 0.5° C./minute, taking into account the efficiency of the heat treatment.

The holding temperature of the graphite/metal composite material is preferably (the melting point of each metal-10° C.) or less and 200° C. or higher. When the holding temperature is higher than the melting point of each metal-10° C., the metal is softened or melted, so that it is likely to elute from the porous graphitized extrudate. On the other hand, when the holding temperature is lower than 200° C., sufficient heat treatment effects cannot be obtained. The holding time may be about 1 to 120 minutes.

Because the graphite/metal composite material held at the above temperature is preferably cooled slowly, its cooling speed is preferably 20° C./minute or less, more preferably 10° C./minute or less. When the cooling speed is more than 20° C./minute, thermal hysteresis remains in the impregnating metal. The lower limit of the cooling speed may be about 0.5° C./minute, taking into account the efficiency of the heat treatment.

The heat treatment may be conducted on the metal-impregnated porous graphitized extrudate 21, and the metal-impregnated graphite/metal composite material cut along a surface perpendicular to the extrusion direction may be heat-treated. The former is more preferable from the aspect of the production process.

The preferred heat treatment conditions of each metal-impregnated graphite/metal composite material are shown in Table 2 below.

TABLE 1

| Molten Metal[1] | Melt-Forging Temperature (° C.) | |
|---|---|---|
| | Preferable Range | More Preferable Range |
| Aluminum | 600 to 900 | 700 to 900 |
| Copper | 1100 to 1400 | 1200 to 1400 |
| Silver | 1000 to 1300 | 1100 to 1300 |
| Magnesium | 700 to 900 | 750 to 900 |
| Zinc | 500 to 800 | 600 to 800 |

Note:
[1]True of alloys of each metal.

TABLE 2

| | Heat Treatment Conditions[1] of Graphite/Metal Composite Material | | |
|---|---|---|---|
| Impregnating Metal | Temperature-Elevating Speed (° C.) | Holding Temperature (° C.) | Cooling Speed (° C.) |
| Aluminum | 0.5 to 30 (2 to 10) | 200 to 550 (450 to 550) | 0.5 to 20 (2 to 10) |
| Copper | 0.5 to 30 (2 to 10) | 300 to 1000 (800 to 1000) | 0.5 to 20 (2 to 10) |
| Silver | 0.5 to 30 (2 to 10) | 300 to 900 (700 to 900) | 0.5 to 20 (2 to 10) |

TABLE 2-continued

| | Heat Treatment Conditions[1] of Graphite/Metal Composite Material | | |
|---|---|---|---|
| Impregnating Metal | Temperature-Elevating Speed (° C.) | Holding Temperature (° C.) | Cooling Speed (° C.) |
| Magnesium | 0.5 to 30 | 200 to 650 | 0.5 to 20 |
| | (2 to 10) | (550 to 650) | (2 to 10) |
| Zinc | 0.5 to 30 | 200 to 450 | 0.5 to 20 |
| | (2 to 10) | (300 to 450) | (2 to 10) |

Note:
[1]Upper rows show preferred ranges, and lower rows show more preferred ranges.

(C) Properties (1) Thermal Conductivity

Because the graphite/metal composite material of the present invention has a structure, in which a high-thermal-conductivity metal has entered into the voids of the porous graphitized extrudate at a high pressure, it has an extremely high thermal conductivity due to the graphite. In addition, because the graphite skeleton per se has anisotropy because of its structure as an extrudate, it has different thermal conductivities in the extrusion direction and a direction perpendicular thereto. The porous graphitized extrudate per se has a thermal conductivity of 150 W/mK or more in the extrusion direction, and 80 W/mK or more in the perpendicular direction. Accordingly, the composite material has a thermal conductivity of 250 W/mK or more in the extrusion direction, and 150 W/mK or more in the perpendicular direction, regardless of the type of the impregnating metal. Further, the feature of the present invention is that the thermal conductivity of the graphite/metal composite material is further improved by a heat treatment.

The thermal conductivity of each graphite/metal composite material before and after the heat treatment is shown in Table 3 below.

TABLE 3

| Impregnating Metal | Thermal Conductivity (W/mK)[1] of Graphite/Metal Composite Material Before and After Heat Treatment | |
|---|---|---|
| | In Extrusion Direction | In Perpendicular Direction |
| Aluminum | After: 280-340 | After: 230-300 |
| | Before: 240-300 | Before; 220-260 |
| Copper | After: 290-350 | After: 240-300 |
| | Before: 240-300 | Before: 230-270 |
| Silver | After: 290-350 | After: 240-300 |
| | Before: 240-300 | Before: 230-270 |
| Magnesium | After: 250-300 | After: 190-250 |
| | Before: 210-240 | Before: 140-180 |
| Zinc | After: 250-300 | After: 180-250 |
| | Before: 200-230 | Before: 130-170 |

Note:
[1]Upper rows show the thermal conductivity ranges after the heat treatment, and lower rows show those before the heat treatment.

(2) Thermal Expansion Coefficient

Because the graphite/metal composite material of the present invention has a skeleton constituted by a porous graphitized extrudate, it has as a whole a thermal expansion coefficient close to that of graphite. Also, because the graphite skeleton is constituted by the extrudate, there are differences in a thermal expansion coefficient between the extrusion direction and the direction perpendicular thereto. The thermal expansion coefficient of the porous graphitized extrudate per se is $3.0 \times 10^{-6}$/K or less in the extrusion direction and $4.0 \times 10^{-6}$/K or less in the perpendicular direction. Accordingly, though slightly different depending on the type of the impregnating metal, the thermal expansion coefficient of the composite material is as small as less than $4.0 \times 10^{-6}$/K in the extrusion direction, and $10 \times 10^{-6}$/K or less in the perpendicular direction expansion coefficient. Further, the feature of the present invention is that the thermal expansion coefficient of the graphite/metal composite material is further lowered by a heat treatment.

The thermal expansion coefficient and dimensional change ratio of each graphite/metal composite material before and after the heat treatment are shown in Table 4 below.

TABLE 4

| | Thermal Expansion Coefficient $(\times 10^{-6}/K)$[1] of Graphite/Metal Composite Material Before and After Heat Treatment | | |
|---|---|---|---|
| Impregnating Metal | In Extrusion Direction | In Perpendicular Direction | Dimensional Change Ratio (%)[2] |
| Aluminum | After: 0.7-3.9 | After: 4.0-10.0 | After: 0.1 or less |
| | Before: 4.1-10.0 | Before: 10.5-20.0 | Before: >0.1 |
| Copper | After: 0.7-3.5 | After: 4.0-10.0 | After: 0.1 or less |
| | Before: 5.0-9.0 | Before: 10.5-15.0 | Before: >0.1 |
| Silver | After: 0.7-3.9 | After: 4.1-10.0 | After: 0.1 or less |
| | Before: 4.1-12.0 | Before: 10.5-21.0 | Before: >0.1 |
| Magnesium | After: 1.0-3.9 | After: 5.0-10.0 | After: 0.1 or less |
| | Before: 4.1-15.0 | Before: 10.5-25.0 | Before: >0.1 |
| Zinc | After: 1.0-3.9 | After: 5.0-10.0 | After: 0.1 or less |
| | Before: 4.1-18.0 | Before: 10.5-28.0 | Before: >0.1 |

Note:
[1]Upper rows show the ranges of the thermal expansion coefficient and the dimensional change ratio after the heat treatment, and lower rows show those before the heat treatment.
[2][(size after thermal hysteresis − size before thermal hysteresis)/size before thermal hysteresis] × 100. The thermal hysteresis is a cycle of heating from room temperature to a predetermined temperature (aluminum: 500° C., copper: 900° C., silver: 850° C., magnesium: 550° C., zinc: 350° C.) and then cooling to room temperature.

(3) Thermal Expansion Hysteresis

The thermal expansion of the graphite/metal composite material before the heat treatment has a thermal hysteresis. Namely, the graphite/metal composite material before the heat treatment has such poor dimensional stability that when it is heated and then cooled to room temperature, it does not return from a thermally expanded state to the original size. It has been found, however, that the graphite/metal composite material is provided with an extremely reduced dimensional change ratio by the heat treatment according to the present invention. The graphite/metal composite material with an excellent dimensional stability suffers substantially no dimensional change when it is used for a heat-dissipating substrate and thus subjected to heat by soldering or brazing. Accordingly, the heat-dissipating substrate does not warp, so that unnecessary stress is not applied to heat-generating devices such as semiconductor devices or laser devices.

(4) Other Properties

The resistivity of the graphite/metal composite material slightly decreases by the heat treatment. Decrease in the resistivity is remarkable particularly in the extrusion direction. The resistivity of the graphite/metal composite material is preferably 4 μΩm or less in the extrusion direction and 7 μΩm or less in the perpendicular direction. The resistivity of each graphite/metal composite material before and after the heat treatment is shown in Table 5 below.

TABLE 5

| Impregnating Metal | Resistivity (μΩm) of Graphite/Metal Composite Material Before and After Heat Treatment[1] | |
|---|---|---|
| | In Extrusion Direction | In Perpendicular Direction |
| Aluminum | After: 1.0-4.0 | After: 1.0-7.0 |
| | Before: 1.0-4.1 | Before: 1.0-7.1 |
| Copper | After: 1.0-3.0 | After: 1.0-5.0 |
| | Before: 1.0-3.1 | Before: 1.0-5.1 |
| Silver | After: 1.0-3.0 | After: 1.0-5.0 |
| | Before: 1.0-3.0 | Before: 1.0-5.1 |
| Magnesium | After: 1.0-4.0 | After: 1.0-7.0 |
| | Before: 1.0-4.1 | Before: 1.0-7.1 |
| Zinc | After: 1.0-3.0 | After: 1.0-7.0 |
| | Before: 1.0-4.1 | Before: 1.0-7.1 |

Note:
[1]Upper rows show resistivity ranges after the heat treatment, and lower rows show those before the heat treatment.

It is presumed that the decrease of the resistivity of the graphite/metal composite material by the heat treatment is caused by the fact that the heat treatment lowers the amount of oxygen in the impregnating metal, increasing the purity of the metal. The amount of oxygen in the impregnating metal is different depending on the type of the metal. In the graphite/metal composite material before the heat treatment, the amount of oxygen is generally 200 to 400 ppm in aluminum or its alloy, 500 to 1000 ppm in copper or its alloy, 200 to 600 ppm in silver or its alloy, 200 to 600 ppm in magnesium or its alloy, and 500 to 2000 ppm in zinc or its alloy. Particularly in the case of copper or its alloy, the amount of oxygen extremely decreases by the heat treatment. Specifically, the amount of oxygen is as small as 400 ppm or less in the graphite/copper composite material after the heat treatment.

The Young's modulus of the graphite/metal composite material does not substantially change before and after the heat treatment, and it is generally 5 GPa or more in a surface direction, on a necessary level for use in the heat-dissipating substrates. Also, the bending strength of the graphite/metal composite material does not substantially change before and after the heat treatment, and it is generally 10 MPa or more, on a necessary level for use in the heat-dissipating substrates. The increase of a thermal conductivity, the reduction of a thermal expansion coefficient and the improvement of dimensional stability by the heat treatment seem to be mainly due to the fact that a residual strain at the time of melt forging disappears by the heat treatment. Particularly in the case of using an Al—Si alloy, the spheroidization of the needle-shaped structure having high heat resistance by the heat treatment seems to contribute to the improvement of the thermal conductivity. Also, in the case of using copper or its alloy, the reduction of the amount of oxygen functioning to increase heat resistance by the heat treatment seems to contribute to the improvement of the thermal conductivity.

[2] Heat-Dissipating Substrate

The heat-dissipating substrate is obtained by cutting the heat-treated graphite/metal composite material to a predetermined size. Though the heat-dissipating substrate is preferably used as a heat sink or a heat spreader, etc., it may have a structure in which a heat-dissipating fan and a heat spreader are integrated because of excellent workability of the graphite/metal composite material. A surface of the heat-dissipating substrate, onto which a heat-generating device such as a semiconductor device or a laser device, etc. is bonded, is preferably perpendicular to the extrusion direction of the graphite/metal composite material, though it may be in parallel with the extrusion direction.

Figure 3:
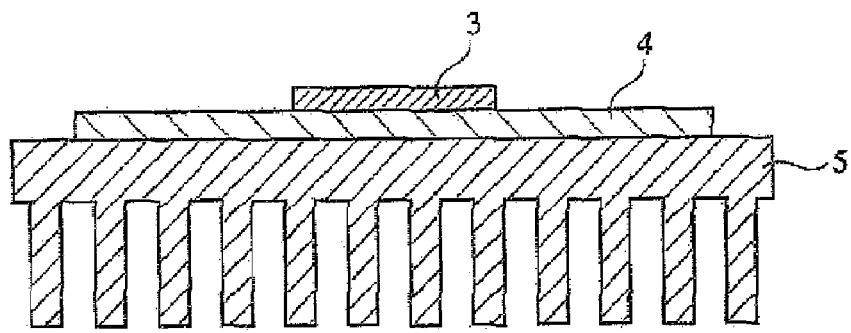
FIG. 3 is a schematic cross-sectional view showing the heat-dissipating substrate of the present invention, to which a semiconductor device is bonded.

As shown in FIG. 3, for instance, when the surface for bonding a semiconductor device 3 is perpendicular to the extrusion direction of the heat-dissipating substrate 4, heat is quickly conducted from the semiconductor device 3 to a heat sink 5 bonded to the other surface of the heat-dissipating substrate 4, because the heat-dissipating substrate 4 has a thermal conductivity larger in the thickness direction than in the surface direction. Because the heat-dissipating substrate 4 has a thermal expansion coefficient larger in the surface direction than in the thickness direction, the thermal expansion coefficient of the heat-dissipating substrate 4 in the surface direction is close to those of both of the semiconductor device 3 and the heat sink 5. Accordingly, no large thermal stress is applied to both interfaces between the heat-dissipating substrate 4 and the semiconductor device 3 and between the heat-dissipating substrate 4 and the heat sink 5 during the operation of the semiconductor device 3.

The semiconductor device 3 is not subjected to a large thermal stress by heating during soldering or brazing for bonding the semiconductor device 3 to the heat-dissipating substrate 4. Further, because the thermal expansion coefficient of the heat-dissipating substrate in the thickness direction is as small as half or less of the thermal expansion coefficient in the surface direction, the heat-dissipating substrate preferably exhibits a small expansion ratio in the height direction during heating for producing a package, so that it is easily positioned in an assembling process.

The method for producing the heat-dissipating substrate is characterized in that the graphite/metal composite material is cut after the heat treatment. If the graphite/metal composite material were cut before the heat treatment, because of poor dimensional stability, the heat-dissipating substrate would be subjected to dimensional change by heating during soldering or brazing or by temperature elevation during the operation. Accordingly, finish working may be needed to achieve dimensional precision, or the bonding interfaces of the heat-dissipating substrate may have poor reliability.

The heat-dissipating substrate cut to a predetermined size is preferably coated with a metal layer to secure the sealing of a package. Though the metal layer is usually formed on the entire surface of the heat-dissipating substrate, the sealing of the package can be secured by forming the metal layer at least on a surface for mounting a semiconductor device, etc. (and a rear surface). The sealing is enough when the amount of a helium gas leaked is $1 \times 10^{-2}$ Pa·cm$^3$/s or less.

The method of forming the metal layer may be a CVD method, a vapor deposition method, a sputtering method, a metal paste printing/baking method, a plating method, etc. To achieve enough sealing, the thickness of the metal layer is preferably 0.5 μm to 10 μm. In the case of plating, electroless plating is more preferable than electroplating, because the electroless plating can form a uniform metal layer on the heat-dissipating substrate.

The plating layer is preferably Ni—P, Ni—B, Cu, etc. When the impregnating metal is copper or its alloy, requiring a heat resistance of 700° C. or higher, the Ni—B plating is particularly preferable because it is less diffusion-reactive to the metal and thus stable. The metal layer may be utilized not only for sealing, but also as a primer for adhesion to other parts. Such metal layer desirably improves the adhesion to heat-generating bodies such as semiconductor devices and packages.

Because the heat-dissipating substrate comprising aluminum or its alloy as an impregnating metal has a large thermal conductivity, a thermal expansion coefficient close to those of silicon and compound semiconductors, and good solderability, it is suitable for heat spreaders, etc. for semiconductor devices using soldering for bonding. In addition, because the graphite/aluminum composite material has low melt-forging temperature and heat-treating temperature, it is advantageous in low production cost. Because the heat-dissipating substrate of the present invention has a thermal expansion coefficient closer to those of semiconductor devices and is lighter in weight than conventional heat spreaders composed of copper or aluminum, it is desirable for heat spreaders with grease.

The heat-dissipating substrate comprising copper or its alloy as an impregnating metal has a large thermal conductivity, a small thermal expansion coefficient, and good dimensional stability. In addition, because it is impregnated with copper having a relatively high melting point, it has high heat resistance, undergoing no change at a brazing temperature. Accordingly, it is suitable for applications such as optical transmission packages, etc. including the heat dissipation of laser devices brazed with silver brazing alloys.

In the case of a heat-dissipating substrate having through-holes for fastening, a metal pipe member fitted in each throughhole acts as a reinforcing member, preventing damage such as cracking even when a high fastening torque is applied. Thus, a high fastening torque can be obtained by this fastening structure. The metal pipe member also acts as a heat-conductive member for dispersing a thermal stress concentrated around each throughhole, thereby improving the function of the heat-dissipating substrate.

Because the heat-dissipating substrate comprising silver or its alloy as an impregnating metal is impregnated with silver having a large thermal conductivity and a melting point between those of aluminum and copper, it is suitable for applications requiring a heat resistance of about 900° C.

Because the heat-dissipating substrate comprising magnesium or its alloy as an impregnating metal is impregnated with magnesium having a melting point between those of aluminum and silver, it is suitable for parts requiring a higher heat resistance than that of aluminum.

Because the heat-dissipating substrate comprising zinc or its alloy as an impregnating metal has a larger thermal expansion coefficient than those of substrates impregnated with aluminum, copper, silver, magnesium, etc., it is suitable for bonding to parts having large thermal expansion coefficients, for instance, bonding to heat sinks of aluminum or copper. In addition, it is advantageous in low production cost, because of its low impregnation temperature.

The present invention will be explained in detail referring to Examples below without intention of restricting the present invention thereto.

EXAMPLE 1

Using a porous graphitized extrudate having a specific bulk density of 1.70, an ash content of 0.3% by mass, resistivity of 5.0 μΩm and 8.5 μΩm, respectively, in an extrusion direction and in the direction perpendicular to the extrusion direction, a thermal expansion coefficient of $0.6 \times 10^{-6}$/K and $2.0 \times 10^{-6}$/K, respectively, in an extrusion direction and in the direction perpendicular to the extrusion direction, a thermal conductivity of 230 W/mK and 120 W/mK, respectively, in an extrusion direction and in the direction perpendicular to the extrusion direction, which was obtained by extruding and graphitizing a melt blend of coke particles having an average particle size of 500 μm and pitch, and an Al—Si alloy containing 12% by mass of Si, a graphite/Al—Si composite material was produced under the following conditions.

After the above Al—Si alloy melt (750° C.) was poured into a cavity of a die apparatus (held at 750° C.) shown in FIG. 1(a), in which the above porous graphitized extrudate was placed, an upper punch was lowered to conduct melt-forging at 100 MPa for 5 minutes. An excess portion of the Al—Si alloy was cut off to obtain the graphite/Al—Si composite material. This graphite/Al—Si composite material was subjected to a heat treatment under the following conditions.

Temperature-elevating speed: 2° C./minute
Holding conditions: 500° C.×60 minutes
Cooling speed: 2° C./minute The graphite/Al—Si composite material after the heat treatment was cut to a size of 40.0 mm×20.0 mm×2.0 mm as a sample for a heat-dissipating substrate. The thickness direction of the heat-dissipating substrate was in alignment with the extrusion direction of the composite material.

Samples obtained from the graphite/Al—Si composite materials before and after the heat treatment were measured with respect to the amount of the Al—Si alloy, the amount of a needle-shaped structure in the Si-rich phase in the Al—Si alloy, a bulk density, a thermal conductivity, a thermal expansion coefficient, resistivity, a Young's modulus, a bending strength, and a dimensional change ratio by the following methods. The measurement results are shown in Table 6 below.

(1) The bulk density was an apparent weight per a unit volume.
(2) The thermal conductivity was measured by a thermal constant analyzer TC-7000H by a laser flash method available from ULVAC-RIKO, Inc. according to JIS R 1611.
(3) The thermal expansion coefficient and the dimensional change ratio were measured by a thermomechanical analyzer using a thermal analysis system EXSTAR6000 available from Seiko Instruments Inc.
(4) The resistivity was measured by a four-terminal method using ZEM-2 available from ULVAC-RIKO, Inc.
(5) The Young's modulus was measured by a two-probe method receiving an ultrasonic transmission wave using UVM-2 and a digital oscilloscope.
(6) The bending strength was measured by a three-point bending test method using an autograph AG-G available from Shimadzu Corporation according to JIS R 1601.

COMPARATIVE EXAMPLE 1

A graphite/Al—Si composite material was produced and evaluated in the same manner as in Example 1 except for conducting a heat treatment under the following conditions. The results are shown in Table 6 below.

Temperature-elevating speed: 2° C./minute,
Holding conditions: 150° C.×60 minute, and
Cooling speed: 2° C./minute.

TABLE 6

Properties of Graphite/Al—Si Composite Material

| Items Measured | Measurement Direction | Comparative Example 1 Before HT[1] | Comparative Example 1 After HT | Example 1 Before HT | Example 1 After HT |
|---|---|---|---|---|---|
| Ai-Si Alloy (vol. %)[2] | — | 14 | 14 | 14 | 14 |
| Amount of Needle-Shaped Structure (%) | — | 90 | 90 | 90 | 5 |
| Bulk Density (g/cm$^3$) | — | 2.2 | 2.2 | 2.2 | 2.1 |
| Thermal Conductivity (W/mK) | ED[3] | 300 | 300 | 300 | 340 |
|  | PD[4] | 220 | 220 | 220 | 250 |
| Thermal Expansion Coefficient (×10$^{-6}$/K) | ED | 8.1 | 8.0 | 8.1 | 3.5 |
|  | PD | 17.8 | 17.0 | 17.8 | 6.9 |
| Dimensional Change | ED | 0.18 | 0.18 | 0.18 | 0.01 |

TABLE 6-continued

Properties of Graphite/Al—Si Composite Material

| Items Measured | Measurement Direction | Comparative Example 1 Before HT[1] | Comparative Example 1 After HT | Example 1 Before HT | Example 1 After HT |
|---|---|---|---|---|---|
| Ratio (%) | PD | 0.32 | 0.32 | 0.32 | 0.01 |
| Resistivity (μΩm) | ED | 1.4 | 1.4 | 1.4 | 1.2 |
|  | PD | 1.7 | 1.7 | 1.7 | 1.8 |
| Young's Modulus (GPa) | ED | 18 | 18 | 18 | 18 |
|  | PD | 11 | 11 | 11 | 11 |
| Bending Strength (MPa) | ED | 47 | 46 | 47 | 42 |
|  | PD | 29 | 29 | 29 | 26 |
| Amount of Oxygen in Al—Si alloy (ppm) | — | 250 | 250 | 250 | 200 |

Note:
[1]Heat treatment.
[2]The volume percentage of the Al—Si alloy per the entire graphite/Al—Si composite material (100% by volume).
[3]Extrusion direction.
[4]Direction perpendicular to the extrusion direction.

As is clear from Table 6, the heat treatment increased the thermal conductivity of the graphite/Al—Si composite material, while extremely decreasing the thermal expansion coefficient and dimensional change ratio thereof. There was substantially no change before and after the heat treatment in the resistivity, the Young's modulus and the bending strength. The above results indicate that the heat treatment provided the graphite/Al—Si composite material with desirable properties for heat-dissipating substrates. In Comparative Example 1 on the other hand, there was substantially no change before and after the heat treatment in the thermal conductivity, the thermal expansion coefficient and the dimensional change ratio.

Figure 4A:
FIG. 4(a) is a SIM photograph showing the graphite/Al—Si composite material before the heat treatment in Example 1.
Figure 4B:
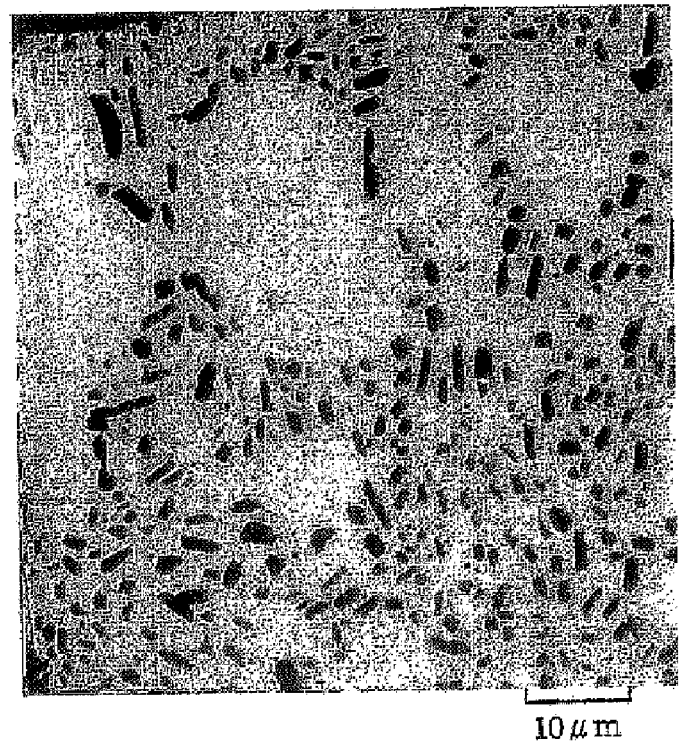
FIG. 4(b) is a SIM photograph showing the graphite/Al—Si composite material after the heat treatment in Example 1.

With respect to samples of the graphite/Al—Si composite materials before and after the heat treatment, the structures of their Al—Si regions were observed by a scanning ion microscope (SIM) FB-2000A available from Hitachi, Ltd. The SIM photographs are shown in FIGS. 4(a) and 4(b). As is clear from FIG. 4(a), a needle-shaped structure composed of a Si-rich phase was precipitated in a sample of the graphite/Al—Si composite material before the heat treatment. In a sample composed of the graphite/Al—Si composite material after the heat treatment, on the other hand, the needle-shaped structure became spheroidal as is clear from FIG. 4(b). In this Example, the percentage (surface area ratio in the photomicrograph) of the needle-shaped structure having a length of 30 μm or less and an aspect ratio (length/diameter) of 10 or more among the silicon-rich phase decreased to 5%. It is presumed that spheroidization decreases the heat resistance of the low-thermal-conductivity Si-rich phase, contributing to increase in the thermal conductivity of the Si-rich phase. It has been found that when the surface area ratio of the needle-shaped structure having a length of 30 μm or less and an aspect ratio of 10 or more among the silicon-rich phase becomes 10% or less, particularly 5% or less, the thermal conductivity of the graphite/Al—Si composite material extremely increases.

Figure 5A:
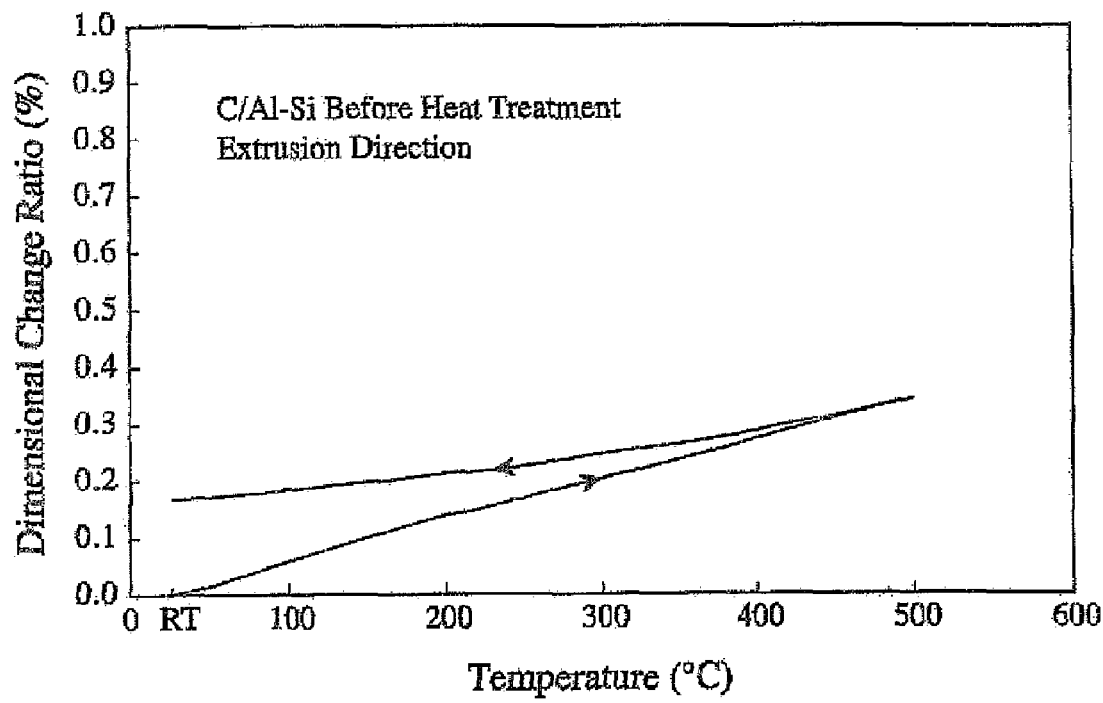
FIG. 5(a) is a graph showing the thermal expansion hysteresis of the graphite/Al—Si composite material before the heat treatment in its extrusion direction in Example 1.
Figure 5B:
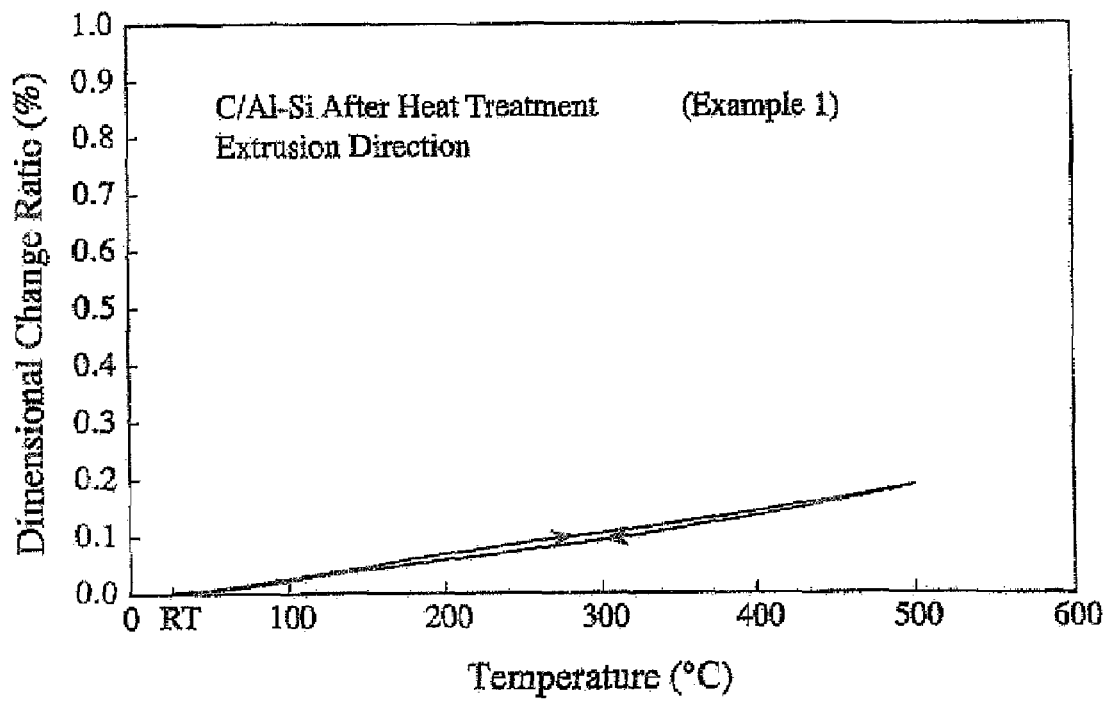
FIG. 5(b) is a graph showing the thermal expansion hysteresis of the graphite/Al—Si composite material after the heat treatment in its extrusion direction in Example 1.
Figure 6A:
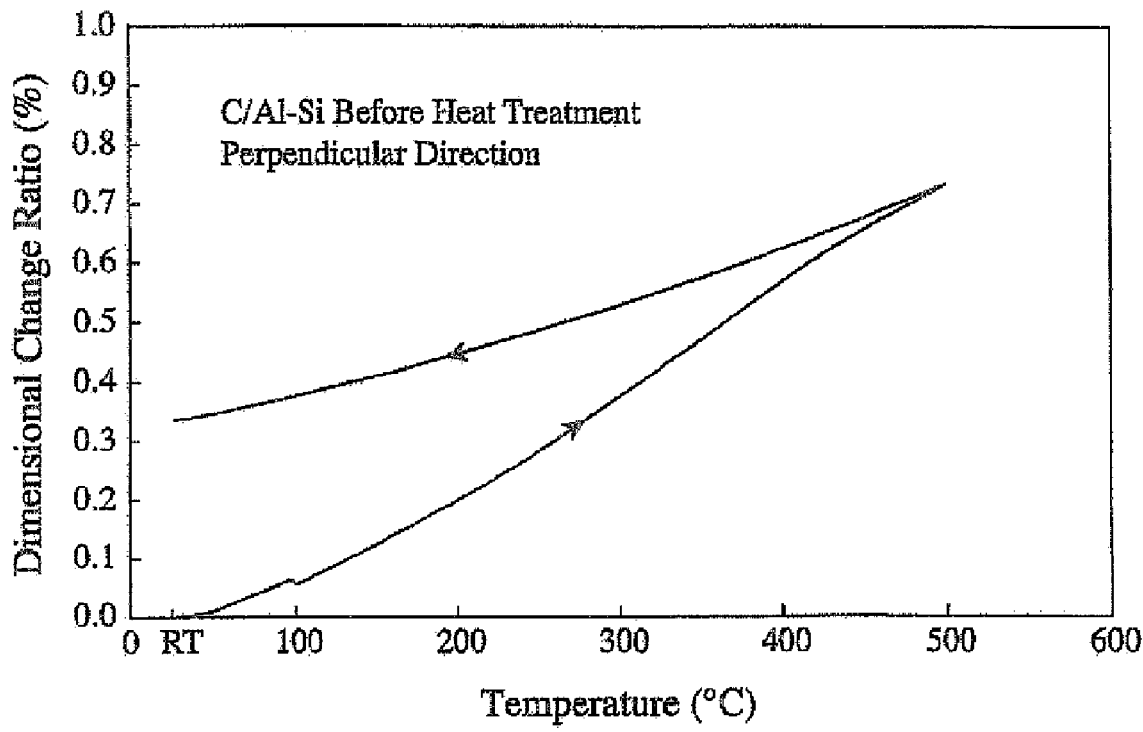
FIG. 6(a) is a graph showing the thermal expansion hysteresis of the graphite/Al—Si composite material before the heat treatment in the perpendicular direction in Example 1.
Figure 6B:
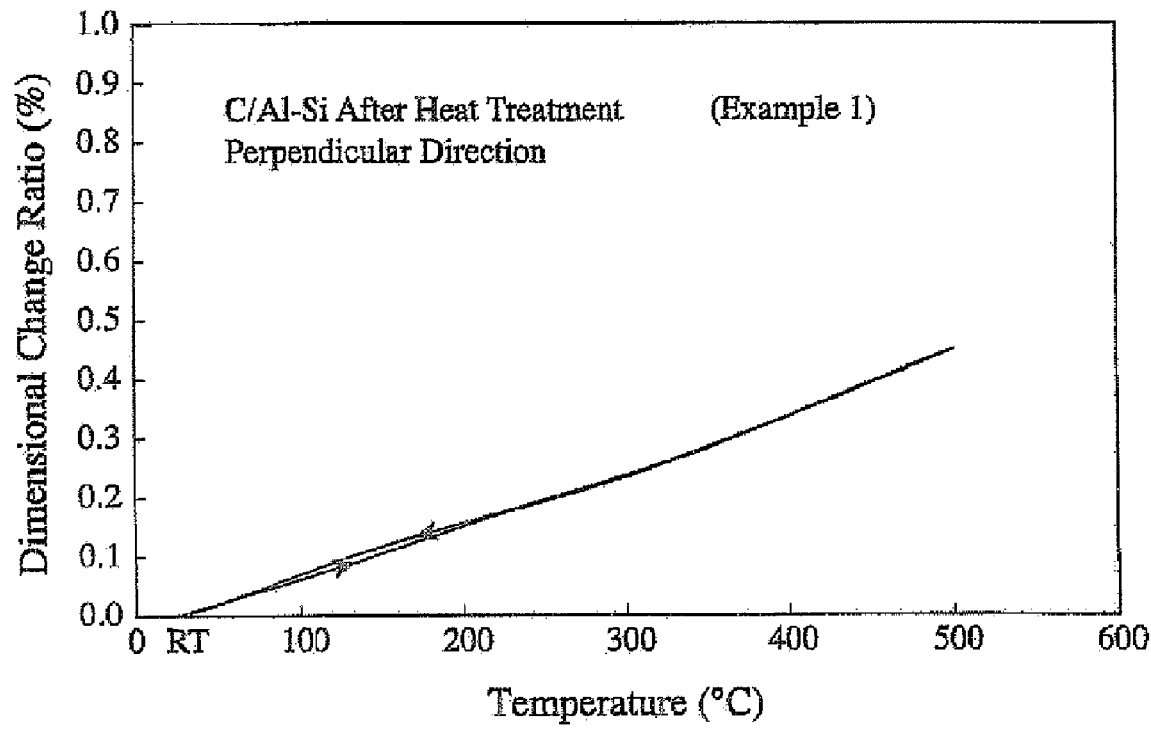
FIG. 6(b) is a graph showing the thermal expansion hysteresis of the graphite/Al—Si composite material after the heat treatment in the perpendicular direction in Example 1.

Samples composed of the graphite/Al—Si composite materials before and after the heat treatment were heated to temperatures ranging from room temperature to 500° C., and left to cool, their hysteresis of thermal expansion was measured in the extrusion direction and a perpendicular direction. The results are shown in FIGS. 5 and 6. As is clear from FIGS. 5(a) and 6(a), the graphite/Al—Si composite material before the heat treatment exhibited a dimensional change ratio of 0.18% in the extrusion direction and 0.32% in the perpendicular direction after the thermal hysteresis. In the graphite/Al—Si composite material after the heat treatment, on the other hand, as is clear from FIGS. 5(b) and 6(b), there was as small a dimensional change ratio as 0.01% in any of the extrusion direction and the perpendicular direction after the thermal hysteresis, indicating that there was substantially no dimensional change. The above results indicate that the graphite/Al—Si composite material of the present invention heat-treated after the metal impregnation suffered from little dimensional change even after the thermal hysteresis, excellent in dimensional stability.

EXAMPLE 2

Using the same porous graphitized extrudate as in Example 1 and pure copper (purity 99.9% or more), a graphite/copper composite material was produced as follows. After a melt (1350° C.) of the above pure copper poured into a cavity of the die apparatus (held at 1000° C.) shown in FIG. 1(a), in which the above porous graphitized extrudate was placed, an upper punch was lowered to conduct melt-forging at 100 MPa for 5 minutes. Excess pure copper was cut away to obtain the graphite/copper composite material. This graphite/copper composite material was subjected to a heat treatment under the following conditions.

Temperature-elevating speed: 5° C./minute,
Holding conditions: 900° C.×120 minutes, and
Cooling speed: 5° C./minute.

The graphite/copper composite material after the heat treatment was cut to a size of 40.0 mm×20.0 mm×2.0 mm to provide a heat-dissipating substrate sample. The thickness direction of the heat-dissipating substrate was in alignment with the extrusion direction of the composite material. Each sample was measured with respect to the amount of copper, a bulk density, a thermal conductivity, a thermal expansion coefficient, a dimensional change ratio (after heating and heat dissipation described below), resistivity, Young's modulus, a bending strength and the amount of oxygen in copper in the same manner as in Example 1. The measurement results are shown in Table 7 below.

COMPARATIVE EXAMPLE 2

A graphite/copper composite material was produced and measured in the same manner as in Example 2 except for using a porous graphitized extrudate having a specific bulk density of 1.58, an ash content of 0.7% by mass, resistivity of 9.0 μΩm and 9.5 μΩm, respectively, in an extrusion direction and in the direction perpendicular to the extrusion direction, a thermal expansion coefficient of $4.0 \times 10^{-6}$/K and $4.2 \times 10^{-6}$/K, respectively, in an extrusion direction and in the direction perpendicular to the extrusion direction, and a thermal conductivity of 130 W/mK and 80 W/mK, respectively, in an extrusion direction and in the direction perpendicular to the extrusion direction. The measurement results are shown in Table 7 below.

TABLE 7

Properties of Graphite/Copper Composite Material

| Items Measured | Measurement Direction[2] | Comparative Example 2 Before HT[1] | Comparative Example 2 After HT | Example 2 Before HT | Example 2 After HT |
|---|---|---|---|---|---|
| Amount of Copper (vol. %)[1] | — | 35 | 35 | 16 | 16 |
| Bulk Density (g/cm³) | — | 4.5 | 4.5 | 3.2 | 3.1 |

TABLE 7-continued

Properties of Graphite/Copper Composite Material

| Items Measured | Measurement | Direction[2] | Comparative Example 2 | | Example 2 | |
|---|---|---|---|---|---|---|
| | | | Before HT[1] | After HT | Before HT | After HT |
| Thermal Conductivity (W/mK) | | ED[3] | 160 | 180 | 300 | 350 |
| | | PD[4] | 130 | 150 | 220 | 250 |
| Thermal Expansion Coefficient ($\times 10^{-6}$/K) | | ED | 12.0 | 7.0 | 6.1 | 1.7 |
| | | PD | 13.5 | 8.0 | 11.9 | 5.8 |
| Dimensional Change Ratio (%) | | ED | 0.60 | 0.05 | 0.35 | 0.02 |
| | | PD | 0.50 | 0.03 | 0.40 | 0.01 |
| Resistivity ($\mu\Omega$m) | | ED | 10.0 | 10.0 | 1.6 | 1.1 |
| | | PD | 11.0 | 11.0 | 1.7 | 1.8 |
| Young's Modulus (GPa) | | ED | 25 | 25 | 15 | 16 |
| | | PD | 20 | 20 | 10 | 10 |
| Bending Strength (MPa) | | ED | 45 | 44 | 38 | 30 |
| | | PD | 35 | 32 | 24 | 20 |
| Amount of Oxygen in Copper (ppm) | | — | 1000 | 400 | 850 | 150 |

Note:
[1]Heat treatment.
[2]The volume percentage of copper per the entire graphite/Al—Si composite material (100% by volume).
[3]Extrusion direction.
[4]Direction perpendicular to the extrusion direction.

As is clear from Table 7, the heat treatment provided the graphite/copper composite material with a slightly increased thermal conductivity and an extremely decreased thermal expansion coefficient. With respect to the resistivity, the Young's modulus and the bending strength, there was substantially no change before and after the heat treatment. The above results indicate that the graphite/copper composite material got desirable properties for heat-dissipating substrates by the heat treatment. On the other hand, the graphite/copper composite material of Comparative Example 2 had a low thermal conductivity and a large thermal expansion coefficient even after the heat treatment, though its dimensional change ratio deceased by the heat treatment.

Figure 7A:
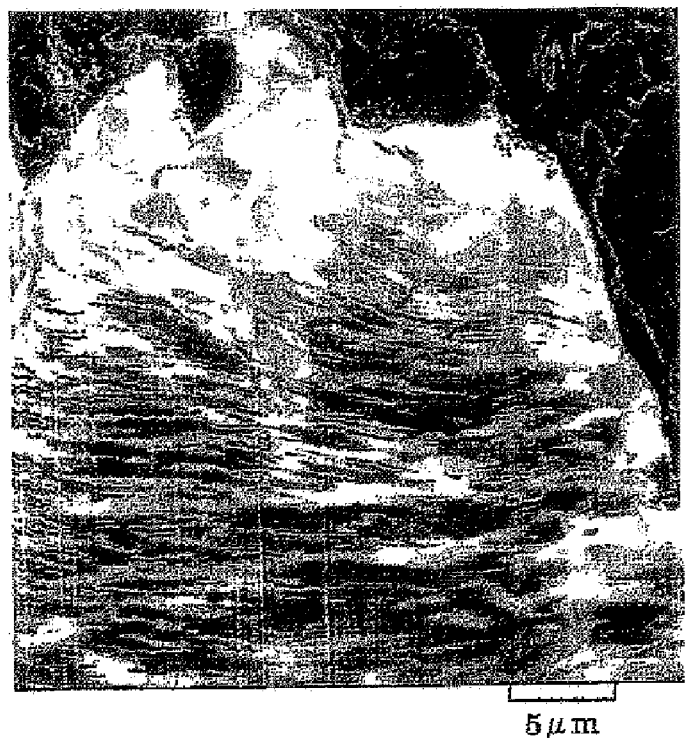
FIG. 7(a) is a SIM photograph showing the graphite/copper composite material before the heat treatment in Example 2.
Figure 7B:
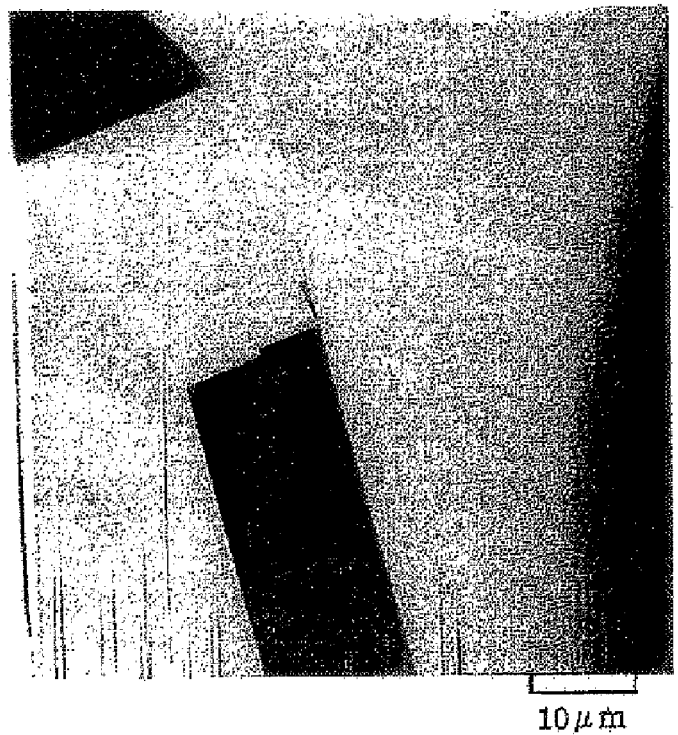
FIG. 7(b) is a SIM photograph showing the graphite/copper composite material after the heat treatment in Example 2.

With respect to samples composed of the graphite/copper composite materials before and after the heat treatment, a copper region was observed by a scanning ion microscope (SIM). The SIM photograph is shown in FIG. 7. As is clear from FIG. 7(a), a sample composed of the graphite/copper composite material before the heat treatment had a copper phase with a typical structure. On the other hand, as is clear from FIG. 7(b), a sample composed of the graphite/copper composite material after the heat treatment had a copper phase changed to an equiaxial crystal, with oxygen in an extremely reduced amount. It is presumed that decrease in the amount of oxygen reducing heat resistance results in the improvement of a thermal conductivity.

Figure 8A:
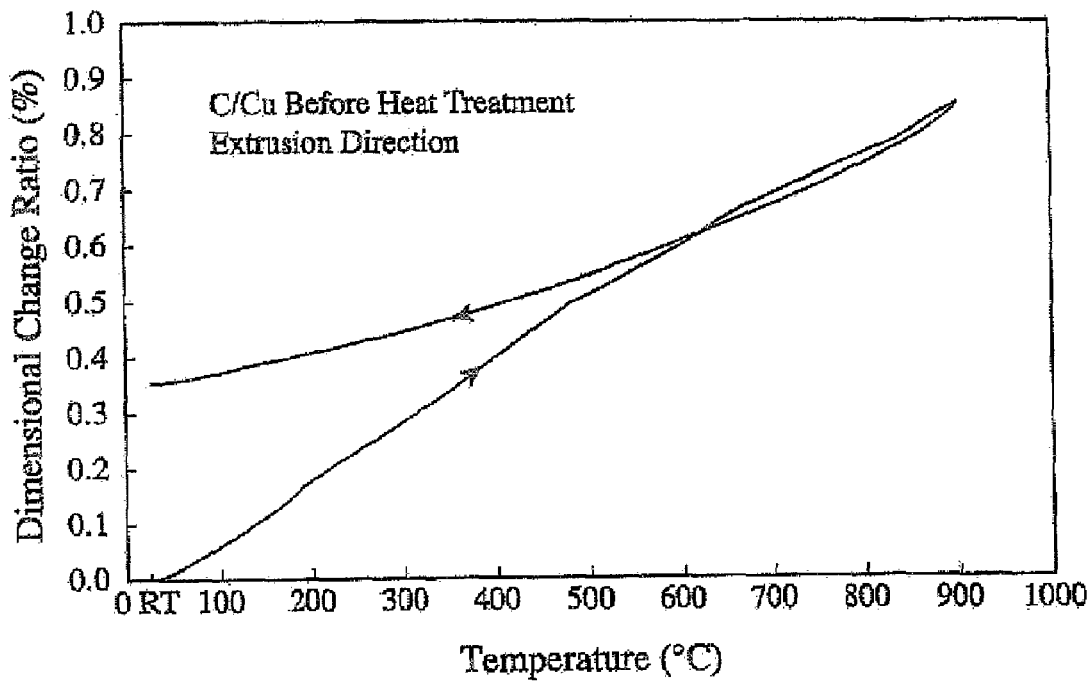
FIG. 8(a) is a graph showing the thermal expansion hysteresis of the graphite/copper composite material before the heat treatment in its extrusion direction in Example 2.
Figure 8B:
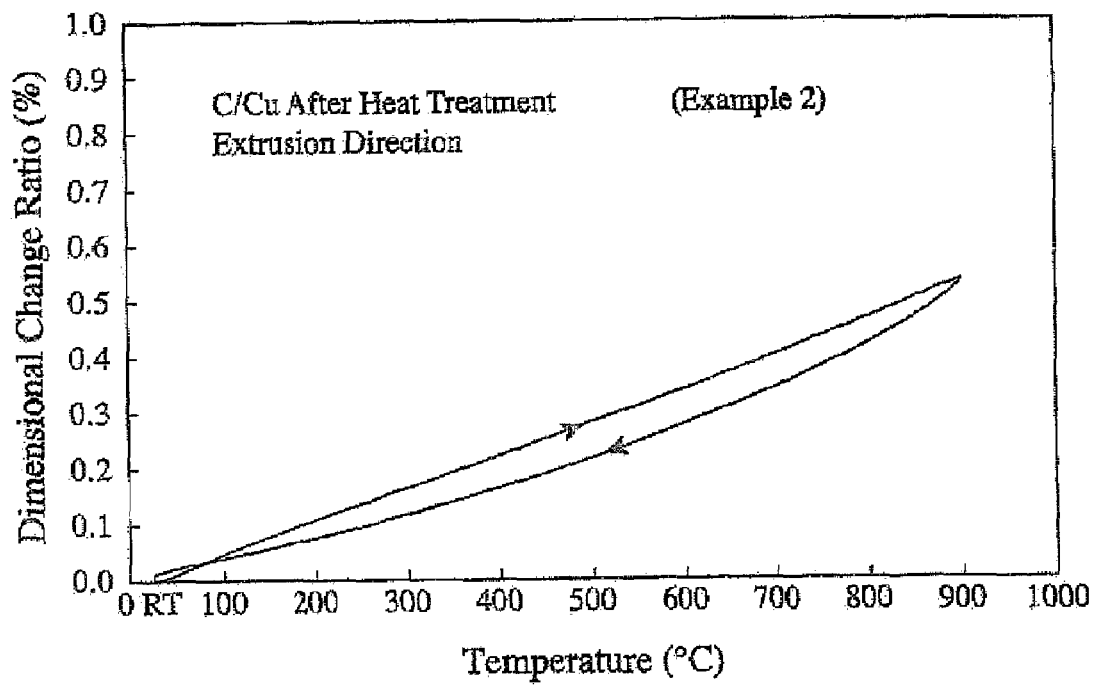
FIG. 8(b) is a graph showing the thermal expansion hysteresis of the graphite/copper composite material after the heat treatment in its extrusion direction in Example 2.
Figure 9A:
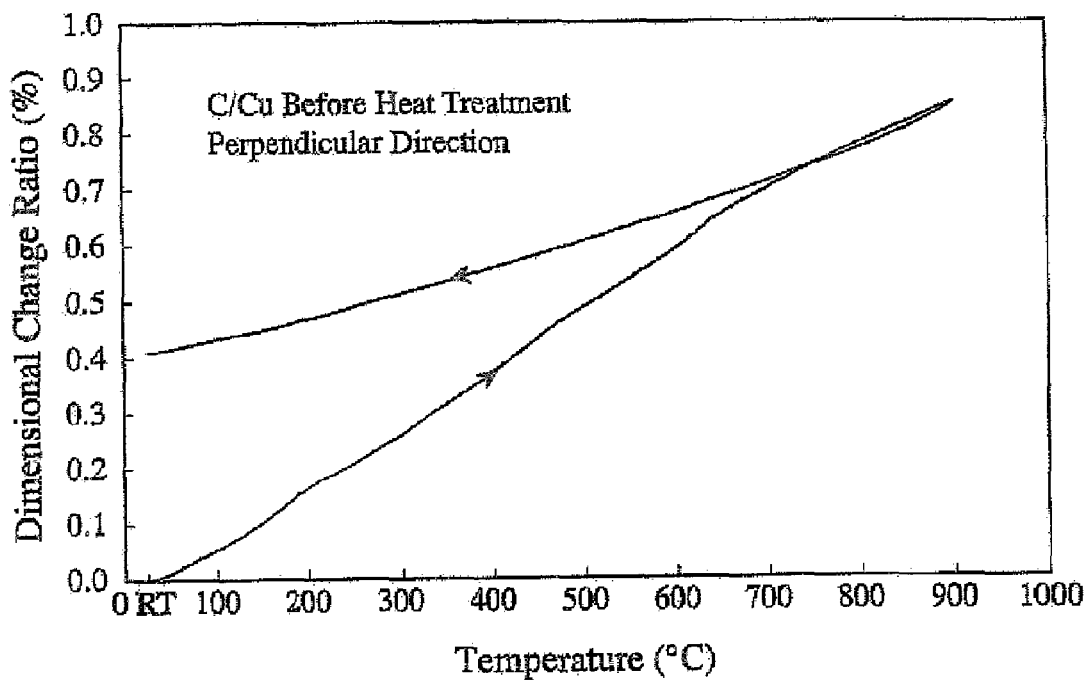
FIG. 9(a) is a graph showing the thermal expansion hysteresis of the graphite/copper composite material before the heat treatment in the perpendicular direction in Example 2.
Figure 9B:
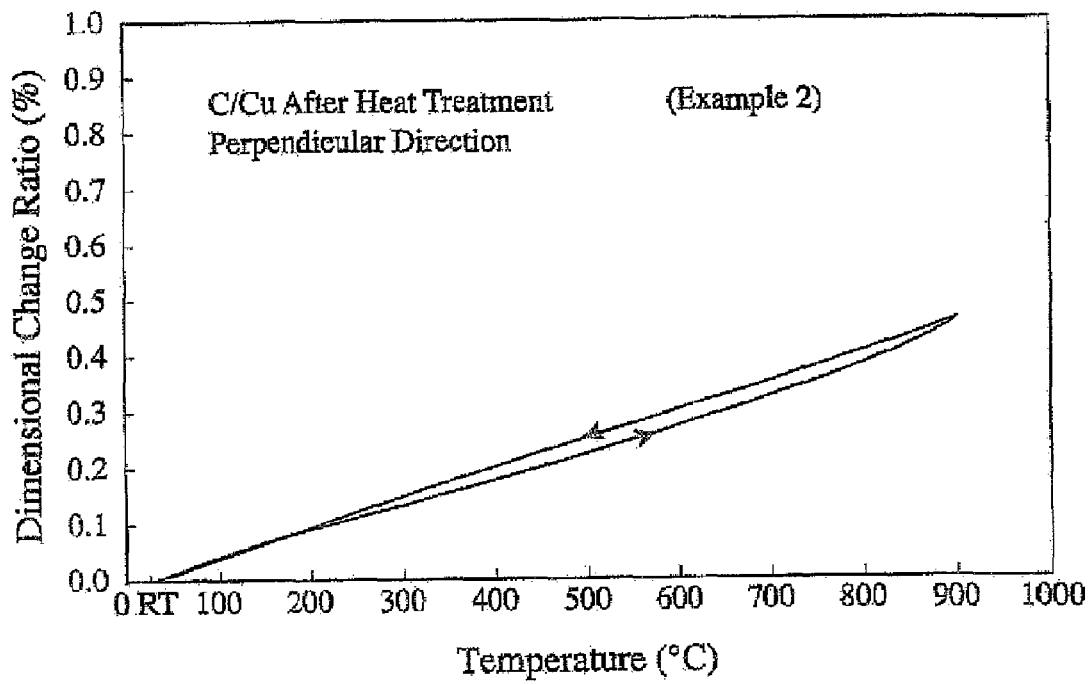
FIG. 9(b) is a graph showing the thermal expansion hysteresis of the graphite/copper composite material after the heat treatment in the perpendicular direction in Example 2.

Samples composed of the graphite/copper composite materials before and after the heat treatment were heated to temperatures ranging from room temperature to 900° C. and then left to cool to measure a thermal expansion hysteresis in both extrusion and perpendicular directions. The results are shown in FIGS. 8 and 9. As is clear from FIGS. 8(a) and 9(a), the graphite/copper composite material before the heat treatment had a dimensional change ratio of 0.35% and 0.40%, respectively, in an extrusion direction and a perpendicular direction after cooling. And as is clear from FIGS. 8(b) and 9(b), the graphite/copper composite material after the heat treatment had a dimensional change ratio of 0.02% and 0.01%, respectively, in an extrusion direction and a perpendicular direction, with substantially no dimensional change. This reveals that the graphite/copper composite material of the present invention has a small dimensional change and thus excellent dimensional stability even after heating.

EXAMPLE 3

Using the same porous graphitized extrudate as in Example 1 having a specific bulk density of 1.70, an ash content of 0.3% by mass, resistivity of 5.0 $\mu\Omega$m and 8.5 $\mu\Omega$m, respectively, in an extrusion direction and in the direction perpendicular to the extrusion direction, a thermal expansion coefficient of $0.6 \times 10^{-6}$/K and $2.0 \times 10^{-6}$/K, respectively, in an extrusion direction and in the direction perpendicular to the extrusion direction, and a thermal conductivity of 230 W/mK and 120 W/mK, respectively, in an extrusion direction and in the direction perpendicular to the extrusion direction, and brass comprising 70% by mass of Cu and 30% by mass of Zn, a graphite/brass composite material was produced under the following conditions.

After a melt (1350° C.) of the above brass was poured into a cavity of the die apparatus (held at 1000° C.) shown in FIG. 1(a), in which the above graphite was placed, an upper punch was lowered to conduct melt-forging at 100 MPa for 5 minutes. Excess pure copper was cut away to obtain the graphite/brass composite material. This graphite/brass composite material was subjected to a heat treatment under the following conditions.

Temperature-elevating speed: 5° C./minute,
Holding conditions: 900° C.×120 minutes, and
Cooling speed: 5° C./minute.

The resultant graphite/brass composite material sample was measured with respect to the amount of brass, a bulk density, a thermal conductivity, a thermal expansion coefficient, a dimensional change ratio (after heating and heat dissipation), resistivity, a Young's modulus, a bending strength, and the amount of oxygen in brass in the same manner as in Example 1. The measurement results are shown in Table 8 below.

COMPARATIVE EXAMPLE 3

A graphite/brass composite material was produced and measured in the same manner as in Example 3 except for conducting a heat treatment under the following conditions. The results are shown in Table 8.

Temperature-elevating speed: 5° C./minute,
Holding conditions: 250° C.×120 minutes, and
Cooling speed: 5° C./minute.

TABLE 8

Properties of Graphite/Brass Composite Material

| Items Measured | Measurement direction | Before HT[1] | Comparative Example 3 (After HT) | Example 3 (After HT) |
|---|---|---|---|---|
| Amount of Brass (vol. %)[2] | | 22 | 22 | 22 |
| Bulk Density (g/cm³) | — | 3.2 | 3.2 | 3.1 |
| Thermal Conductivity (W/mK) | ED[3] | 280 | 280 | 330 |
| | PD[4] | 180 | 180 | 220 |
| Thermal Expansion Coefficient ($\times 10^{-6}$/K) | ED | 7.1 | 7.1 | 2.0 |
| | PD | 13.1 | 13.0 | 6.5 |

TABLE 8-continued

Properties of Graphite/Brass Composite Material

| Items Measured | Measurement direction | Before HT[1] | Comparative Example 3 (After HT) | Example 3 (After HT) |
|---|---|---|---|---|
| Dimensional Change Ratio (%) | ED | 0.32 | 0.30 | 0.02 |
| | PD | 0.38 | 0.36 | 0.01 |
| Resistivity ($\mu\Omega$m) | ED | 1.8 | 1.9 | 1.7 |
| | PD | 1.9 | 1.9 | 1.8 |
| Young's Modulus (GPa) | ED | 15 | 15 | 16 |
| | PD | 10 | 10 | 10 |
| Bending Strength (MPa) | ED | 38 | 38 | 36 |
| | PD | 24 | 24 | 23 |
| Amount of Oxygen in Brass (ppm) | — | 850 | 850 | 150 |

Note:
[1]Heat treatment.
[2]The volume percentage of brass per the entire graphite/brass composite material (100% by volume).
[3]Extrusion direction.
[4]Direction perpendicular to the extrusion direction.

EXAMPLE 4

A heat-dissipating substrate of 40.0 mm×20.0 mm×2.0 mm cut out from the graphite/Al—Si alloy composite material (after the heat treatment) of Example 1 shown in Table 6 was subjected to electroless Ni—P plating after a zincate treatment. A heat-dissipating substrate of 40.0 mm×20.0 mm×2.0 mm cut out from the graphite/Cu composite material (after the heat treatment) of Example 2 shown in Table 7 was also subjected to electroless Ni—B plating. To evaluate the correlation of the presence of a plating layer and sealability, the amount of a helium gas passing through each plated heat-dissipating substrate was measured by a helium leak detector DLMS-33 available from ULVAC, Inc. according to JIS C 7021 A-6. The amount of a helium gas passing through the plated heat-dissipating substrate, as the amount of a leaked helium gas, was used as a parameter of sealability. The results are shown in Table 9 below.

TABLE 9

| Type of Substrate | Type of Plating | Thickness ($\mu$m) | Amount of Leaked Helium Gas(×$10^{-2}$ Pa · cm$^3$/s) |
|---|---|---|---|
| Graphite/Al-12Si | Non | — | 1.0 |
| Graphite/Al-12Si | Ni—P | 2 | <0.1 |
| Graphite/Cu | Non | — | 30 |
| Graphite/Cu | Ni—B | 4 | 0.50 |
| Graphite/Cu | Ni—B | 6 | <0.10 |
| Graphite/Cu | Cu | 5 | 0.35 |

It has been found that any of the graphite/Al-12Si and the graphite/Cu was extremely improved in sealability by plating. Incidentally, when the plating thickness is less than 0.5 $\mu$m, sufficient sealability cannot be obtained. On the other hand, when the plating thickness is more than 20 $\mu$m, the remaining stress increases, resulting in peeling of the plating layer. The graphite/Al-12Si composite material, etc. are preferable in high adhesion to a vapor-deposited Al layer. The graphite/Cu composite material, etc. may be printed with an Ag paste and then sintered at 900° C. In this case, because of a low film stress, the film thickness may be as large as about 30 $\mu$m.

EXAMPLE 5

Figure 10:
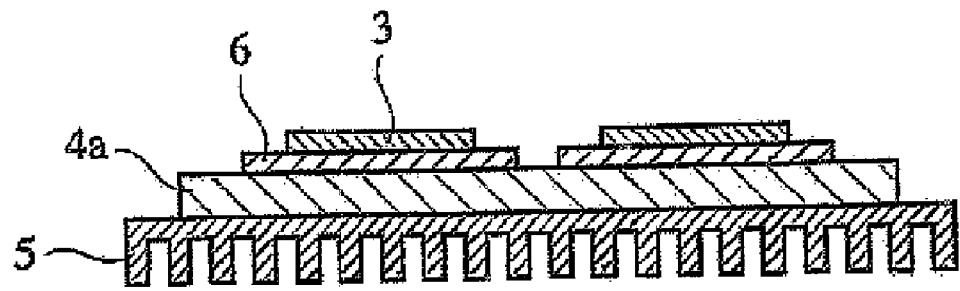
FIG. 10 is cross-sectional view showing an example of a semiconductor module comprising a heat-dissipating substrate formed by the graphite/metal composite material of the present invention.
Figure 11:
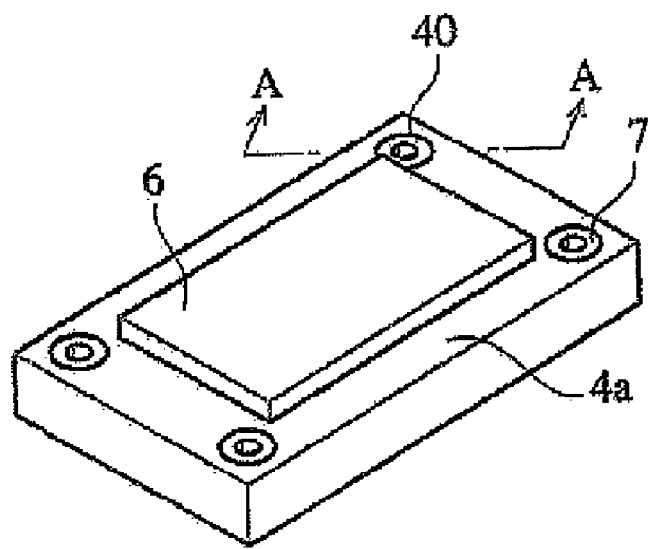
FIG. 11 is a perspective view showing an example of a reinforcing pipe member used as a substrate with through-holes.

FIG. 10 shows an example of a module for mounting semiconductor devices, which comprises a heat-dissipating substrate 4a of 100 mm×100 mm×2 mm formed by the graphite/metal (Cu) composite material of the present invention, an insulating substrate 6 formed by a silicon nitride plate of 30 mm×30 mm×0.8 mm, and a heat sink 5. The insulating substrate 6 was brazed to the heat-dissipating substrate 4a, and after plating the insulating substrate 6 with Ni, semiconductor chips 3 of 10 mm×10 mm were soldered to the insulating substrate 6. The heat-dissipating substrate 4a and the heat sink 5 were mechanically fastened by bolts, etc. via a high-thermal-conductivity grease to provide a module.

The graphite/Cu composite material used in this Example to form the heat-dissipating substrate 4a was impregnated with an copper-chromium alloy containing 1.0% by mass of Cr. The heat-dissipating substrate 4a had a thermal conductivity of 250 W/mK or more in a thickness direction and 150 W/mK or more in a direction perpendicular to the thickness direction (on the side of the device-mounting surface), and a thermal expansion coefficient of more than $0.1\times10^{-6}$/K and less than $4\times10^{-6}$/K in the thickness direction and $4\times10^{-6}$/K or more and $10\times10^{-6}$/K or less in the perpendicular direction.

The heat-dissipating characteristics of the semiconductor module in this Example were evaluated by measuring the surface temperature of each semiconductor chip 3 and thermal resistance (° C./W) between the semiconductor chip 3 and the rear surface of the heat sink 5 during supplying current, and further by measuring thermal resistance between the semiconductor chip 3 and the rear surface of the heat sink 5 after 3000 cycles of a heating/cooling test from −40° C. to 125° C. The thermal resistance after 3000 cycles of the temperature cycle test is expressed by an increment (%) relative to the thermal resistance before the temperature cycle test.

It was thus found that the surface temperature of the semiconductor devices was 52.1° C., that the thermal resistance was 0.23° C./W, and that the increment after the cycle test was 2.5%, indicating that the surface temperature of the semiconductor devices and the thermal resistance were lower, and the increment after the cycle test was smaller than those of conventional ones.

Figure 12A:
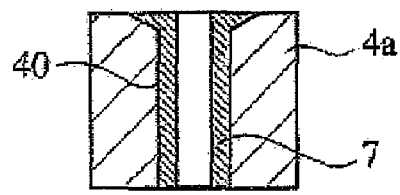
FIG. 12(a) is a cross-sectional view taken along the line A-A in FIG. 11.
Figure 12B:
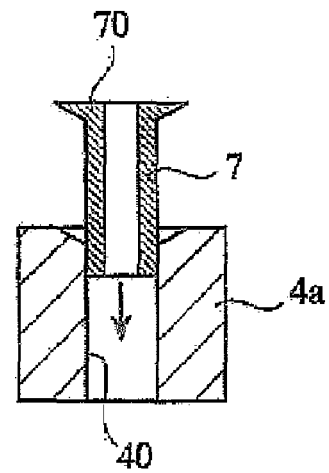
FIG. 12(b) is a cross-sectional view showing a state where a metal pipe member is being fitted in a throughhole of the heat-dissipating substrate shown in FIG. 11.
Figure 12C:
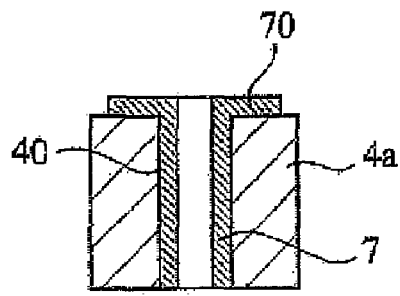
FIG. 12(c) is a cross-sectional view showing another example of a metal pipe member fitted in the throughhole of the heat-dissipating substrate.

When the graphite/metal composite material of the present invention is used for a heat-dissipating substrate 4a, the heat-dissipating substrate 4a may have throughholes for fastening a heat sink 5 as in the above embodiment. In this case, a reinforcing metal pipe member 7 is preferably fitted in each throughhole 40. Though not particularly restrictive, the pipe member 7 may have such a shape as shown in FIGS. 12(a) and (b), or may have a flange 70 as shown in FIG. 12(c), as long as it is fitted in the throughhole 40. Flanges 70 provided on both ends preferably further prevent cracks from generating from the throughholes 40. When the metal pipe member 7 has a flange 70 only on one end, the flange 70 is positioned such that it is in contact with a bolt head.

Figure 12D:
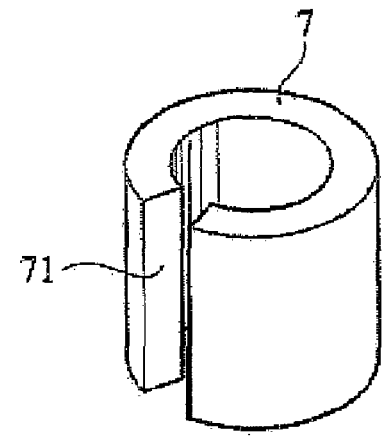
FIG. 12(d) is a perspective view showing a further example of a metal pipe member fitted in the throughhole of the heat-dissipating substrate.
Figure 12E:
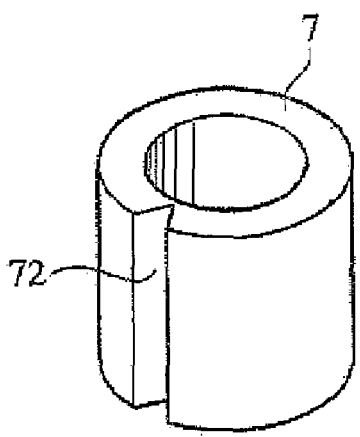
FIG. 12(e) is a perspective view showing a still further example of a metal pipe member fitted in the throughhole of the heat-dissipating substrate.

As shown in FIG. 12(d), the metal pipe member 7 may have a slit 71. Further, as shown in FIG. 12(e), the metal pipe member 7 may have a notch 72. The slit 71 and the notch 72 enable the metal pipe member 7 to elastically deform in a circumferential direction, thereby making it easy to fit the metal pipe member 7 in the throughhole 40. The slit 71 and the notch 72 have a function to buffer a load applied to the substrate due to the expansion of the pipe member 7, which is caused by the heat generation of the substrate. Accordingly, they provide the metal pipe member 7 with sufficient durability to a cooling/heating cycle, a soldering reflow process, etc. The metal bonding such as brazing between the pipe member 7 and the substrate preferably improves their adhesion, resulting in improved heat dissipation.

As described above in detail, the graphite/metal composite material of the present invention has (a) both properties of graphite (small thermal expansion coefficient) and properties of a metal (large thermal conductivity), because it comprises a graphite skeleton and a high-thermal-conductivity metal entering into the voids of the graphite skeleton, and (b) a thermal conductivity slightly improved and a thermal expansion coefficient extremely decreased by the heat treatment. In addition, because the graphite/metal composite material of the present invention has a skeleton of a graphitized extrudate, there are differences in properties between an extrusion direction and a perpendicular direction. Accordingly, with a cutting direction in parallel with the extrusion direction or the perpendicular direction depending on applications, it is possible to obtain the heat-dissipating substrate having desired thermal conductivity and thermal expansion coefficient. Further, because the thermal expansion hysteresis is reduced to substantially zero by the heat treatment, the graphite/metal composite material of the present invention advantageously has excellent dimensional accuracy even after soldering or brazing.

What is claimed is:

1. A method for producing a composite material having a high thermal conductivity and a small thermal expansion coefficient, comprising the steps of
    (1) graphitizing an extrudate of carbon particles and/or carbon fibers and tar pitch by burning to thereby obtain a porous graphitized extrudate;
    (2) impregnating the porous graphitized extrudate with a molten metal at high temperature and pressure wherein said metal is aluminum or an aluminum alloy; and wherein the impregnation of said porous graphitized extrudate with said molten metal is conducted at a temperature higher than the melting point of said molten metal by 10° C. or more and at a pressure of 10 MPa or more to thereby obtain a graphite/metal composite material; and
    (3) heat-treating the graphite/metal composite material after the molten metal is solidified under the conditions of a temperature-elevating speed of 0.5° C./minute to 30° C./minute, then holding the graphite/metal composite material at a temperature between 200° C. and the melting point—10° C. and thereafter cooling the graphite/metal composite material at a cooling speed of 0.5° C./minute to 20° C./minute, thereby removing thermal hysteresis such that the graphite/metal composite material has a dimensional change ratio within ±0.1% in an extrusion direction and in a direction perpendicular to said extrusion direction.

2. The method for producing a composite material having a high thermal conductivity and a small thermal expansion coefficient according to claim 1, wherein said extrudate comprises said carbon particles and said tar pitch; and wherein said carbon particles have an average particle size of 50 µm or more and an ash content of 0.5% by mass or less.

3. The method for producing a composite material having a high thermal conductivity and a small thermal expansion coefficient according to claim 1, wherein said molten metal is impregnated into said porous graphitized extrudate having resistivity of less than 7 µΩm in the extrusion direction and 7 µΩm or more in a direction perpendicular to said extrusion direction and a ratio of said resistivity in said extrusion direction to that in said perpendicular direction being 0.9 or less.

4. The method for producing a composite material having a high thermal conductivity and a small thermal expansion coefficient according to claim 1, wherein said molten metal is impregnated into said porous graphitized extrudate having a thermal expansion coefficient of $3\times10^{-6}$/K or less in the extrusion direction and $4\times10^{-6}$/K or less in a direction perpendicular to said extrusion direction and a ratio of said thermal expansion coefficient in said extrusion direction to that in said perpendicular direction being 0.8 or less.

5. The method for producing a composite material having a high thermal conductivity and a small thermal expansion coefficient according to claim 1, wherein said molten metal is impregnated into said porous graphitized extrudate which has a thermal conductivity of 150 W/mK or more in the extrusion direction and 80 W/mK or more in a direction perpendicular to said extrusion direction and a ratio of said thermal conductivity in said extrusion direction to that in said perpendicular direction being 1.3 or more.

6. A method for producing a heat-dissipating substrate having a high thermal conductivity and a low thermal expansion, comprising the steps of producing a composite material having a high thermal conductivity and a small thermal expansion coefficient by the method recited in claim 1; and then cutting said composite material along a surface perpendicular to an extrusion direction of said porous graphitized extrudate.

7. The method for producing a heat-dissipating substrate according to claim 6, wherein said perpendicular surface is used as a surface onto which a heat-generating body is going to be bonded.

8. The method for producing a heat-dissipating substrate according to claim 6, comprising the steps of cutting said heat-dissipating substrate, and then forming a metal layer at least on a surface, onto which a heat-generating body is going to be bonded.

9. The method for producing a composite material having a high thermal conductivity and a small thermal expansion coefficient according to claim 1, wherein said temperature-elevating speed is 10° C./minute or less.

10. The method for producing a composite material having a high thermal conductivity and a small thermal expansion coefficient according to claim 1, wherein said cooling speed is 10° C./minute or less.

11. A method for producing a composite material having a high thermal conductivity and a small thermal expansion coefficient comprising the steps of
    (1) graphitizing an extrudate of carbon particles and/or carbon fibers and tar pitch by burning to thereby obtain a porous graphitized extrudate;
    (2) impregnating the porous graphitized extrudate with a molten metal at high temperature and pressure, wherein said metal is copper or a copper alloy; and wherein the impregnation of said porous graphitized extrudate with said molten metal is conducted at a temperature higher than the melting point of said molten metal by 10° C. or more and at a pressure of 10 MPa or more to thereby obtain a graphite/metal composite material; and
    (3) heat-treating the graphite/metal composite material after the molten metal is solidified under the conditions of a temperature-elevating speed of 0.5° C. /minute to 30° C./minute, then holding the graphite/metal composite material at a temperature between 300° C. and the melting point-10° C., and thereafter cooling the graphite/metal composite material at a cooling speed of 0.5° C./minute to 20° C./minute, thereby removing thermal hysteresis such that the graphite/metal composite material has a dimensional change ratio within±0.1% in an extrusion direction and in a direction perpendicular to said extrusion direction.

12. The method for producing a composite material having a high thermal conductivity and a small thermal expansion coefficient according to claim 11, wherein said extrudate comprises said carbon particles and said tar pitch; and wherein said carbon particles have an average particle size of 50 μm or more and an ash content of 0.5% by mass or less.

13. The method for producing a composite material having a high thermal conductivity and a small thermal expansion coefficient according to claim 11, wherein said molten metal is impregnated into said porous graphitized extrudate having resistivity of less than 7 μΩm in the extrusion direction and 7 μΩm or more in a direction perpendicular to said extrusion direction and a ratio of said resistivity in said extrusion direction to that in said perpendicular direction being 0.9 or less.

14. The method for producing a composite material having a high thermal conductivity and a small thermal expansion coefficient according to claim 11, wherein said molten metal is impregnated into said porous graphitized extrudate which has a thermal expansion coefficient of $3\times10^{-6}$/K or less in the extrusion direction and $4\times10^{-6}$/K or less in a direction perpendicular to said extrusion direction; and wherein a ratio of said thermal expansion coefficient in said extrusion direction to that in said perpendicular direction is being 0.8 or less.

15. The method for producing a composite material having a high thermal conductivity and a small thermal expansion coefficient according to claim 11, wherein said molten metal is impregnated into said porous graphitized extrudate having a thermal conductivity of 150 W/mK or more in the extrusion direction and 80 W/mK or more in a direction perpendicular to said extrusion direction and a ratio of said thermal conductivity in said extrusion direction to that in said perpendicular direction being 1.3 or more.

16. A method for producing a heat-dissipating substrate having a high thermal conductivity and a low thermal expansion, comprising the steps of producing a composite material having a high thermal conductivity and a small thermal expansion coefficient by the method recited in claim 11; and then cuffing said composite material along a surface perpendicular to an extrusion direction of said porous graphitized extrudate.

17. The method for producing a heat-dissipating substrate according to claim 16, wherein said perpendicular surface is used as a surface onto which a heat-generating body is going to be bonded.

18. The method for producing a heat-dissipating substrate according to claim 16, comprising the steps of cuffing said heat-dissipating substrate, and then forming a metal layer at least on a surface, onto which a heat-generating body is going to be bonded.

19. The method for producing a composite material having a high thermal conductivity and a small thermal expansion coefficient according to claim 11, wherein said temperature-elevating speed is 10° C./minute or less.

20. The method for producing a composite material having a high thermal conductivity and a small thermal expansion coefficient according to claim 11, wherein said cooling speed is 10° C./minute or less.

* * * * *